(12) United States Patent
Kubo et al.

(10) Patent No.: US 10,844,842 B2
(45) Date of Patent: Nov. 24, 2020

(54) ABNORMALITY MONITORING APPARATUS AND ABNORMALITY MONITORING METHOD FOR WIND FARM

(71) Applicant: MITSUBISHI HEAVY INDUSTRIES, LTD., Tokyo (JP)

(72) Inventors: Hiroyoshi Kubo, Tokyo (JP); Kazunari Ide, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 313 days.

(21) Appl. No.: 15/997,209

(22) Filed: Jun. 4, 2018

(65) Prior Publication Data

US 2018/0363633 A1 Dec. 20, 2018

(30) Foreign Application Priority Data

Jun. 14, 2017 (JP) .................................. 2017-117031

(51) Int. Cl.
*F03D 17/00* (2016.01)
*G01R 21/00* (2006.01)
(Continued)

(52) U.S. Cl.
CPC ............. *F03D 17/00* (2016.05); *F03D 7/048* (2013.01); *G01L 1/242* (2013.01); *G01R 21/001* (2013.01);
(Continued)

(58) Field of Classification Search
CPC ...... F03D 17/00; F03D 7/048; F05B 2260/80; F05B 2270/335; F05B 2270/808; G01L 1/242; G01R 21/001
(Continued)

(56) References Cited

U.S. PATENT DOCUMENTS 6,925,385 B2    8/2005   Ghosh et al.
7,013,203 B2    3/2006   Moore et al.
(Continued)

FOREIGN PATENT DOCUMENTS

EP    2592447 A1    5/2013
EP    2993344 A     3/2016
(Continued)

OTHER PUBLICATIONS

Europe Patent Office, "Search Report for European Patent Application No. 18170968.4," dated Nov. 22, 2018.
(Continued)

*Primary Examiner* — John H Le
(74) *Attorney, Agent, or Firm* — Manabu Kanesaka; Benjamin Hauptman; Kenneth Berner

(57) ABSTRACT

An abnormality monitoring apparatus for a wind farm includes: a parameter obtaining part configured to obtain a power generation parameter related to power generation of the wind turbine power generating apparatus and a strain parameter measured by a sensor mounted to a wind turbine blade of the wind turbine power generating apparatus; a member candidate extraction part configured to extract at least two of the wind turbine power generating apparatuses in which a correlation between the power generation parameters of the at least two wind turbine power generating apparatuses is not smaller than a first predetermined value, and a correlation between the strain parameters of the at least two wind turbine power generating apparatuses is not smaller than a second predetermined value; a monitoring group setting part configured to set at least two of the wind turbine power generating apparatuses; and a group monitoring part configured to perform abnormality monitoring.

18 Claims, 11 Drawing Sheets

(51) Int. Cl.
*G01L 1/24* (2006.01)
*F03D 7/04* (2006.01)
(52) U.S. Cl.
CPC ..... *F05B 2260/80* (2013.01); *F05B 2270/335* (2013.01); *F05B 2270/808* (2013.01)
(58) Field of Classification Search
USPC ..... 702/39, 42, 179, 182, 184, 188; 73/1.01; 290/44; 416/41, 61; 700/286, 287
See application file for complete search history.

(56) References Cited

U.S. PATENT DOCUMENTS

| | | | |
|---|---|---|---|
| 7,887,292 | B2 | 2/2011 | Kuehlmeier |
| 8,130,112 | B2 | 3/2012 | Gram-Hansen et al. |
| 8,180,498 | B2 | 5/2012 | Zhu et al. |
| 8,277,183 | B2 | 10/2012 | Qu |
| 8,538,729 | B2 | 9/2013 | Gram-Hansen et al. |
| 8,660,706 | B2 | 2/2014 | Szemkus |
| 8,977,403 | B2 | 3/2015 | Ichinose |
| 2002/0029097 | A1 | 3/2002 | Pionzio, Jr. et al. |
| 2008/0078228 | A1* | 4/2008 | Nies ........................ G01W 1/18 73/1.01 |
| 2011/0020122 | A1 | 1/2011 | Parthasarathy et al. |
| 2011/0270577 | A1 | 11/2011 | Mihok et al. |
| 2011/0313726 | A1 | 12/2011 | Parthasarathy et al. |
| 2013/0015662 | A1 | 1/2013 | Bertolotti et al. |
| 2013/0173073 | A1 | 7/2013 | Breeze et al. |
| 2013/0204579 | A1 | 8/2013 | Volkmer et al. |
| 2013/0261988 | A1 | 10/2013 | Lim et al. |
| 2014/0093373 | A1 | 4/2014 | Schmidt et al. |
| 2015/0142175 | A1 | 5/2015 | Reimers et al. |
| 2016/0245262 | A1* | 8/2016 | Ide ........................ G01M 11/085 |

FOREIGN PATENT DOCUMENTS

| | | |
|---|---|---|
| GB | 2477968 A | 8/2011 |
| JP | 2009-243428 A | 10/2009 |
| JP | 5101396 B2 | 12/2012 |
| JP | 2016-156674 A | 9/2016 |
| WO | 2010/121615 A1 | 10/2010 |
| WO | 2011/143531 A2 | 11/2011 |
| WO | 2017/088877 A1 | 6/2017 |

OTHER PUBLICATIONS

Japan Patent Office, "Office Action for Japanese Patent Application No. 2017-117031," dated Mar. 10, 2020.

K. Yoneda et al., "Nonlinear Canonical Correlation Analysis of Multi-view Data by Metric Learning between SOMs," IEICE Technical Report, May 19, 2017, p. 1-6, vol. 117, No. 64, The Institute of Electronics, Information and Communication Engineers.

* cited by examiner

FIG. 3

*CC: CORRELATION COEFFICIENT

|  |  | 6a | 6b | 6c | ... |
|---|---|---|---|---|---|
| 6a | CC OF FIRST BLADE LP STRAIN AMOUNT PEAK | — | — | — | ... |
|  | CC OF WIND VELOCITY | >V₁ | — | — | ... |
|  | CC OF POWER GENERATION AMOUNT | >V₁ | — | — | ... |
| 6b | CC OF FIRST BLADE LP STRAIN AMOUNT PEAK | <V₁ | >V₁ |  | ... |
|  | CC OF WIND VELOCITY | >V₁ | >V₁ |  | ... |
|  | CC OF POWER GENERATION AMOUNT | >V₁ | >V₁ |  | ... |
| 6c | ... |  |  |  | ... |

(N rows × N columns)

*WTG: WIND TURBINE POWER GENERATING APPARATUS

US 10,844,842 B2

ABNORMALITY MONITORING APPARATUS AND ABNORMALITY MONITORING METHOD FOR WIND FARM

RELATED APPLICATIONS

The present application is based on, and claims priority from, Japanese Application No. JP2017-117031 filed Jun. 14, 2017, the disclosure of which is hereby incorporated by reference herein in its entirety.

TECHNICAL FIELD

The present disclosure relates to an abnormality monitoring apparatus and an abnormality monitoring method for a wind farm.

BACKGROUND ART

In recent years, wind turbine power generating apparatuses have become increasingly popular in view of environmental preservation, and wind farms are being installed, which are collective wind turbine power generation facilities each including a plurality of wind turbine power generating apparatuses built in the same area. To ensure good economy of such wind turbine power generation, each wind turbine power generating apparatus needs to continue stable operation, and it is critical to find an abnormality of a wind turbine power generating apparatus in an early stage. Thus, a remote monitoring device (SCADA) is used, for instance, to monitor each wind turbine power generating apparatus of a wind farm from a remote place.

For instance, Patent Document 1 discloses a monitoring system for a wind turbine group configured to determine a wind turbine showing a different characteristic value as abnormal, from among a plurality of wind turbines (wind turbine power generating apparatuses) constituting a wind farm, through partial or overall state monitoring of the plurality of wind turbines, in order to enhance the monitoring accuracy of wind turbines.

Similarly, Patent Document 2 discloses using data from all or a partial sub set of a plurality of wind turbines (wind turbine power generating apparatuses) constituting a wind farm to determine normality of a group. Specifically, the document discloses comparing performance parameters of a wind turbine set of the same area to prevent unnecessary abnormality alarms, detecting an abnormality through data analysis on each wind turbine by principal component analysis (PCA), and using PCA analysis from each of the wind turbines or other collected data to perform better abnormality prediction of a trouble of a wind turbine with a reduced detection error rate.

Furthermore, Patent Document 3, for instance, discloses a method of monitoring the state of a wind turbine power generating apparatus through measurement of a strain amount with a fiber-optic sensor mounted to a wind turbine blade (e.g. root portion), whereby presence or absence of a damage to the wind turbine blade is monitored on the basis of a wavelength fluctuation index which indicates a fluctuation amount of the wavelength of reflection light from a sensor part (FGB). Furthermore, the fluctuation amount of the wavelength measured at each of the plurality of blades mounted to the wind turbine is compared to each other, and when the amount exceeds a pre-set threshold, it is determined that an abnormality is present.

CITATION LIST

Patent Literature

Patent Document 1: JP2009-243428A
Patent Document 2: US2011/0313726A
Patent Document 3: JP2016-156674A

SUMMARY

As described above, in Patent Documents 1 and 2, to enhance the monitoring accuracy, abnormality monitoring is performed on a monitoring group including a part or all of the wind turbine power generating apparatuses constituting a wind farm. Usually, an error in abnormality determination is found during a thorough investigation conducted after the abnormality determination, and may cause deterioration of the economy of the wind turbine power generation. Thus, further improvement of the monitoring accuracy is desirable.

In view of the above, an object of at least one embodiment of the present invention is to provide an abnormality monitoring apparatus of a wind farm capable of accurately performing abnormality monitoring of a monitoring group including a plurality of wind turbine power generating apparatuses.

(1) An abnormality monitoring apparatus for a wind farm, which is configured to perform abnormality monitoring on a monitoring group including at least two of a plurality of wind turbine power generating apparatuses belonging to a windfarm, according to at least one embodiment of the present invention, includes: a parameter obtaining part configured to obtain, from each of at least two of the plurality of wind turbine power generating apparatuses, a power generation parameter related to power generation of the wind turbine power generating apparatus and a strain parameter measured by a sensor mounted to a wind turbine blade of the wind turbine power generating apparatus; a member candidate extraction part configured to extract, as member candidates of the monitoring group, at least two of the wind turbine power generating apparatuses in which a correlation between the power generation parameters of the at least two wind turbine power generating apparatuses obtained by the parameter obtaining part is not smaller than a first predetermined value, and a correlation between the strain parameters of the at least two wind turbine power generating apparatuses is not smaller than a second predetermined value; a monitoring group setting part configured to set, as members of the monitoring group, at least two of the wind turbine power generating apparatuses from among the member candidates; and a group monitoring part configured to perform abnormality monitoring on the monitoring group set by the monitoring group setting part.

A measurement value of a sensor mounted to a wind turbine blade for measuring a strain amount, for instance, is under influence of a mounted state of a sensor to the wind turbine blade and the external environment. The present inventors found that the level of the influence differs among the sensors, and that there is individual variability. For instance, a fiber-optic sensor measures a strain amount by utilizing a change in the optic characteristics of reflection light from a grating (FBG) constituting the sensor part in response to a change in the refractive index and the grating spacing of the grating in response to the strain amount. The refractive index and spacing of the grating changes depending not only the strain amount but also the ambient temperature, and the change due to the temperature differs among individual sensors.

With the above configuration (1), the monitoring group includes at least two wind turbine power generating apparatuses in which correlation is strong not only among the power generation parameters (e.g. correlation coefficient), but also among the strain parameters. The power generation parameter is an index which shows a strong correlation to a power generation condition such as wind velocity, rotor rotation speed, and power generation amount, for instance. The strain parameter is an index showing a strong correlation to the strain amount of the wind turbine blade. That is, the monitoring group includes at least two wind turbine power generating apparatuses with strong correlations among the power generation parameters and among individual differences of the sensors mounted thereto. Thus, the individual variability of sensors in the monitoring group is also similar. Accordingly, in the monitoring group, it is possible to suppress wrong detection of an abnormality due to deviance, from the normal value, of the measurement value of a sensor having a great individual variability due to a change in the external environment, and to enhance the accuracy of abnormality monitoring of the monitoring group including at least two wind turbine power generating apparatuses, thus improving the reliability of the abnormality monitoring.

(2) In some embodiments, in the above configuration (1), the member candidate extraction part includes: a first member candidate group selection part configured to select a first member candidate group including at least two of the plurality of wind turbine power generating apparatuses; a parameter correlation calculation part configured to obtain a correlation between the power generation parameters of the wind turbine power generating apparatuses belonging to the first member candidate group; a second member candidate group selection part configured to select, from the first member candidate group, a second member candidate group including at least two of the wind turbine power generating apparatuses in which the correlation obtained by the power generation parameter correlation calculation part is not smaller than the first predetermined value; a strain parameter correlation calculation part configured to obtain a correlation between the strain parameters of the wind turbine power generating apparatuses belonging to the second member candidate group; and a member candidate determination part configured to determine, as the member candidates, the wind turbine power generating apparatuses in which the correlation obtained by the strain parameter correlation calculation part is not smaller than the second predetermined value, from the second member candidate group.

With the above configuration (2), after evaluating the correlation of the power generation parameters, the correlation of the strain parameters is evaluated. Accordingly, it is possible to extract at least two wind turbine power generating apparatuses in which the correlation of the power generation parameters and the correlation of the strain parameters are strong, efficiently.

(3) In some embodiments, in the above configuration (1) or (2), the abnormality monitoring apparatus further includes a canonical correlation learning part configured to obtain a canonical correlation between the power generation parameter and the strain parameter of the wind turbine power generating apparatus belonging to the monitoring group, in learning before execution of the abnormality monitoring by the group monitoring part. The group monitoring part is configured to perform the abnormality monitoring on the monitoring group on the basis of the canonical correlation obtained by the canonical correlation learning part.

With the above configuration (3), it is possible to set the determination criteria of abnormal monitoring by the group monitoring part through machine learning.

(4) In some embodiments, in the above configuration (3), the group monitoring part includes: a canonical correlation deviance determination part configured to determine whether the canonical correlation obtained during the learning is maintained to be between a monitoring power generation parameter and a monitoring strain parameter obtained during the abnormality monitoring; and an abnormality determination part configured to determine presence of an abnormality if the canonical correlation deviance determination part determines that the canonical correlation is not maintained.

With the above configuration (4), it is determined that an abnormality is present if the canonical correlation between the power generation parameter and the strain parameter in learning of the wind turbine power generating apparatuses belonging to the monitoring group is not maintained in abnormality monitoring. Accordingly, it is possible to detect presence of a wind turbine power generating apparatus in an abnormal state among the monitoring group.

(5) In some embodiments, in the above configuration (4), the canonical correlation deviance determination part includes: a monitored value calculation part configured to calculate a monitored value based on the monitoring power generation parameter; a predicted value calculation part configured to calculate a predicted value of the monitored value from the monitoring strain parameter, by using the canonical correlation obtained during the learning; and a deviance determination part configured to determine whether the canonical correlation obtained during the learning is maintained, on the basis of comparison between the monitored value and the predicted value.

With the above configuration (5), it is possible to determine easily whether the canonical correlation in learning is maintained in monitoring, on the basis of comparison between the monitored value calculated on the basis of the power generation parameter obtained in abnormality monitoring and the predicted value of the monitored value calculated on the basis of the strain parameter (monitoring strain parameter).

(6) In some embodiments, in any one of the above configurations (3) to (5), the abnormality monitoring apparatus further includes a principal component analysis part configured to obtain, by using a result of a principal component analysis to be performed on the power generation parameter of each of the wind turbine power generating apparatuses belonging to the monitoring group, a power generation parameter principal component which is a principal component of the power generation parameter on which the principal component analysis is performed. The canonical correlation learning part is configured to obtain the canonical correlation between the power generation parameter principal component and the strain parameter of each of the wind turbine power generating apparatuses belonging to the monitoring group.

With the above configuration (6), it is possible to obtain the canonical correlation between the principal component of the power generation parameter (power generation parameter principal component) and the strain parameter of the wind turbine power generating apparatuses belonging to the monitoring group. By using the principal component of the power generation parameter to obtain the canonical correlation, it is possible to reduce an influence of deviance components of the plurality of power generation parameters from the plurality of wind turbine power generating apparatuses belonging to the monitoring group, and to improve accuracy in abnormality monitoring.

(7) In some embodiments, in the above configuration (6), the abnormality monitoring apparatus further includes a strain parameter principal component analysis part configured to obtain, by using a result of a principal component analysis to be performed on the strain parameter of each of the wind turbine power generating apparatuses belonging to the monitoring group, a strain parameter principal component which is a principal component of the strain parameter on which the principal component analysis is performed. The canonical correlation learning part is configured to obtain the canonical correlation between the power generation parameter principal component and the strain parameter principal component.

With the above configuration (7), it is possible to obtain the canonical correlation between the principal component of the power generation parameter (power generation parameter principal component) and the principal component of the strain parameter (strain parameter principal component) of the wind turbine power generating apparatuses belonging to the monitoring group. By using the principal component of the strain parameter to obtain the canonical correlation, it is possible to reduce an influence of deviance components of the plurality of strain parameters from the plurality of wind turbine power generating apparatuses belonging to the monitoring group, and to improve accuracy in abnormality monitoring.

(8) In some embodiments, in any one of the above configurations (6) to (7), the power generation parameter includes at least one kind of parameter from among a wind velocity, a power generation amount, and a rotor rotation speed. The power generation principal component analysis part is configured to obtain the power generation parameter principal component for each kind of the power generation parameter.

With the above configuration (8), the power generation parameters include at least one kind of parameter from among wind velocity, power generation amount, and rotor rotation speed, and the principal component analysis is performed on each kind of parameter. Wind velocity is related to input information of wind energy to the wind turbine power generating apparatuses. Rotor rotation speed is related to information on conversion of wind energy inputted to the wind turbine power generating apparatuses into mechanical (rotational) energy. Further, power generation amount is related to output information of wind energy to the wind turbine power generating apparatuses. Thus, by monitoring at least one kind of parameter from among wind velocity, power generation amount, and rotor rotation speed, it is possible to monitor the normality of the wind turbine power generating apparatuses. Furthermore, it is possible to specify the location of an abnormality by monitoring more than one kind of parameter.

(9) In some embodiments, in any one of the above configurations (1) to (8), the sensor mounted to the wind turbine blade is a sensor part included in an optical fiber sensor.

With the above configuration (9), even in a case where there is individual variability between fiber-optic sensors mounted to each of the wind turbine power generating apparatuses belonging to the monitoring group, it is possible to suppress influence of the individual variability on the abnormality monitoring for the monitoring group.

(10) An abnormality monitoring method for a wind farm, of performing abnormality monitoring on a monitoring group including at least two of a plurality of wind turbine power generating apparatuses belonging to a windfarm, according to at least one embodiment of the present invention, includes: a parameter obtaining step of obtaining, from each of at least two of the plurality of wind turbine power generating apparatuses, a power generation parameter related to power generation of the wind turbine power generating apparatus and a strain parameter measured by a sensor mounted to a wind turbine blade of the wind turbine power generating apparatus; a member candidate extraction step of extracting, as member candidates of the monitoring group, at least two of the wind turbine power generating apparatuses in which a correlation between the power generation parameters of the at least two wind turbine power generating apparatuses obtained in the parameter obtaining step is not smaller than a first predetermined value, and a correlation between the strain parameters of the at least two wind turbine power generating apparatuses is not smaller than a second predetermined value; a monitoring group setting step of setting, as members of the monitoring group, at least two of the wind turbine power generating apparatuses from among the member candidates; and a group monitoring step of performing abnormality monitoring on the monitoring group set in the monitoring group setting step.

With the above configuration (10), it is possible to achieve the same effect as the above (1).

(11) In some embodiments, in the above configuration (10), the member candidate extraction step includes: a first member candidate group selection step of selecting a first member candidate group including at least two of the plurality of wind turbine power generating apparatuses; a parameter correlation calculation step of obtaining a correlation between the power generation parameters of the wind turbine power generating apparatuses belonging to the first member candidate group; a second member candidate group selection step of selecting, from the first member candidate group, a second member candidate group including at least two of the wind turbine power generating apparatuses in which the correlation obtained in the power generation parameter correlation calculation step is not smaller than the first predetermined value; a strain parameter correlation calculation step of obtaining a correlation between the strain parameters of the wind turbine power generating apparatuses belonging to the second member candidate group; and a member candidate determination step of determining, as the member candidates, the wind turbine power generating apparatuses in which the correlation obtained in the strain parameter correlation calculation step is not smaller than the second predetermined value, from the second member candidate group.

With the above configuration (11), it is possible to achieve the same effect as the above (2).

(12) In some embodiments, in any one of the above configurations (10) to (11), the method further includes a canonical correlation learning step of obtaining a canonical correlation between the power generation parameter and the strain parameter of the wind turbine power generating apparatus belonging to the monitoring group, in learning before execution of the abnormality monitoring in the group monitoring step. The group monitoring step is configured to perform the abnormality monitoring on the monitoring group on the basis of the canonical correlation obtained in the canonical correlation learning step.

With the above configuration (12), it is possible to achieve the same effect as the above (3).

(13) In some embodiments, in the above configuration (12), the group monitoring step includes: a canonical correlation deviance determination step of determining whether the canonical correlation obtained during the learning is maintained to be between a monitoring power generation parameter and a monitoring strain parameter obtained during the abnormality monitoring; and an abnormality determination step of determining presence of an abnormality if it is determined that the canonical correlation is not maintained in the canonical correlation deviance determination step.

With the above configuration (13), it is possible to achieve the same effect as the above (4).

(14) In some embodiments, in the above configuration (13), the canonical correlation deviance determination step includes: a monitored value calculation step of calculating a monitored value based on the monitoring power generation parameter; a predicted value calculation step of calculating a predicted value of the monitored value from the monitoring strain parameter, by using the canonical correlation obtained during the learning; and a deviance determination step of determining whether the canonical correlation obtained during the learning is maintained, on the basis of comparison between the monitored value and the predicted value.

With the above configuration (14), it is possible to achieve the same effect as the above (5).

(15) In some embodiments, in any one of the above configurations (12) to (14), the method includes a principal component analysis step of obtaining, by using a result of a principal component analysis to be performed on the power generation parameter of each of the wind turbine power generating apparatuses belonging to the monitoring group, a power generation parameter principal component which is a principal component of the power generation parameter on which the principal component analysis is performed. The canonical correlation learning step includes obtaining the canonical correlation between the power generation parameter principal component and the strain parameter of each of the wind turbine power generating apparatuses belonging to the monitoring group.

With the above configuration (15), it is possible to achieve the same effect as the above (6).

(16) In some embodiments, in the above configuration (15), the method further includes a strain parameter principal component analysis step of obtaining, by using a result of a principal component analysis to be performed on the strain parameter of each of the wind turbine power generating apparatuses belonging to the monitoring group, a strain parameter principal component which is a principal component of the strain parameter on which the principal component analysis is performed. The canonical correlation learning step includes obtaining the canonical correlation between the power generation parameter principal component and the strain parameter principal component.

With the above configuration (16), it is possible to achieve the same effect as the above (7).

(17) In some embodiments, in any one of the above configurations (15) to (16), the power generation parameter includes at least one kind of parameter from among a wind velocity, a power generation amount, and a rotor rotation speed, and the power generation principal component analysis step includes obtaining the power generation parameter principal component for each kind of the power generation parameter.

With the above configuration (17), it is possible to achieve the same effect as the above (8).

(18) In some embodiments, in any one of the above configurations (10) to (17), the sensor mounted to the wind turbine blade is a sensor part included in an optical fiber sensor.

With the above configuration (18), it is possible to achieve the same effect as the above (9).

According to at least one embodiment of the present invention, provided is an abnormality monitoring apparatus for a wind farm capable of accurately performing abnormality monitoring of a monitoring group including a plurality of wind turbine power generating apparatuses.

BRIEF DESCRIPTION OF DRAWINGS

FIG. 3 is a diagram showing an image of an evaluation result of a correlation coefficient of a plurality of wind turbine power generating apparatuses according to an embodiment of the present invention.

DETAILED DESCRIPTION

Embodiments of the present invention will now be described in detail with reference to the accompanying drawings. It is intended, however, that unless particularly identified, dimensions, materials, shapes, relative positions and the like of components described in the embodiments shall be interpreted as illustrative only and not intended to limit the scope of the present invention.

For instance, an expression of relative or absolute arrangement such as "in a direction", "along a direction", "parallel", "orthogonal", "centered", "concentric" and "coaxial" shall not be construed as indicating only the arrangement in a strict literal sense, but also includes a state where the arrangement is relatively displaced by a tolerance, or by an angle or a distance whereby it is possible to achieve the same function.

For instance, an expression of an equal state such as "same" "equal" and "uniform" shall not be construed as indicating only the state in which the feature is strictly equal, but also includes a state in which there is a tolerance or a difference that can still achieve the same function.

Further, for instance, an expression of a shape such as a rectangular shape or a cylindrical shape shall not be construed as only the geometrically strict shape, but also includes a shape with unevenness or chamfered corners within the range in which the same effect can be achieved.

On the other hand, an expression such as "comprise", "include", "have", "contain" and "constitute" are not intended to be exclusive of other components.

Figure 1:
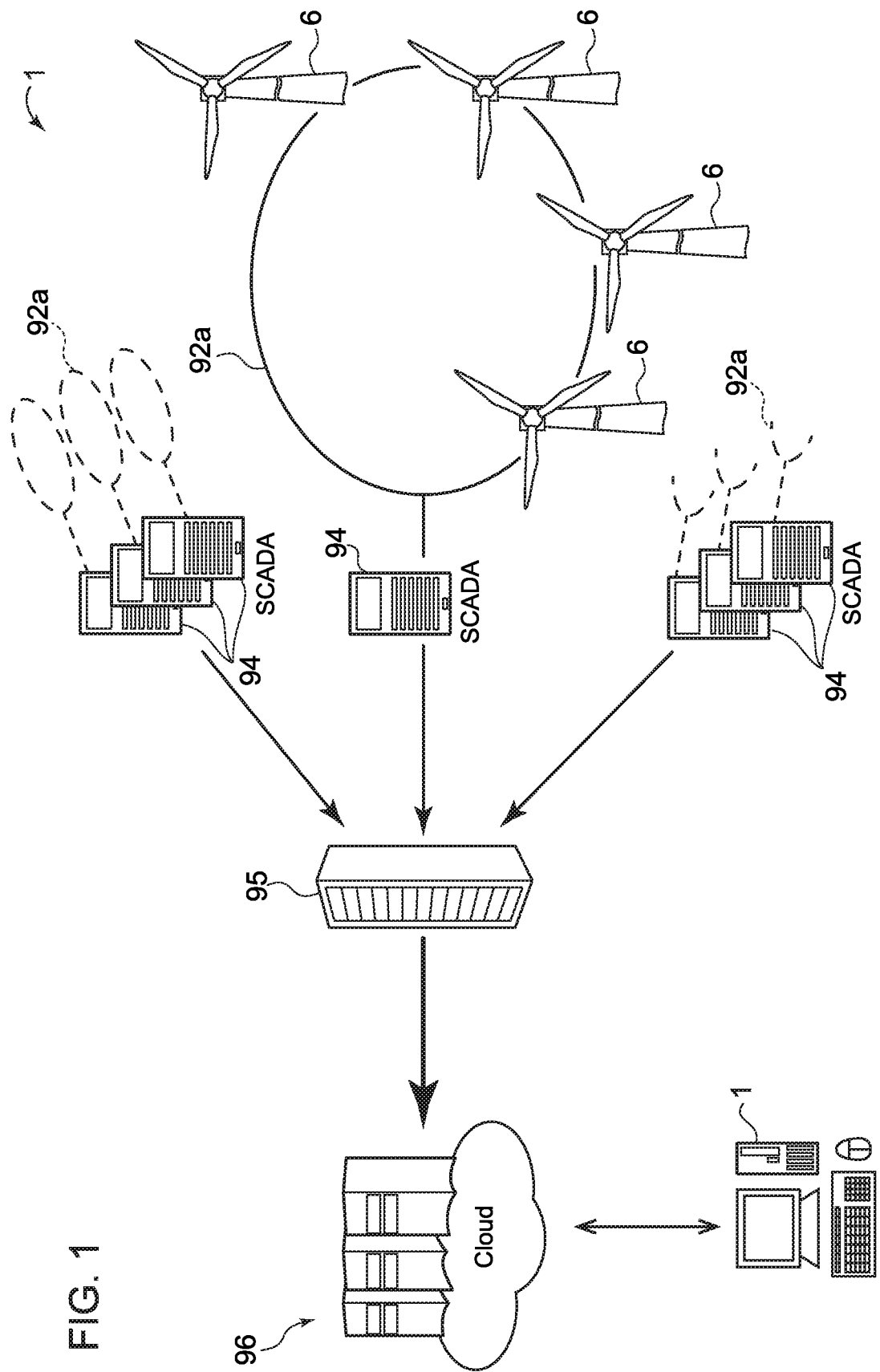
FIG. 1 is a schematic diagram of a monitoring system configuration of a wind farm according to an embodiment of the present invention.
Figure 2:
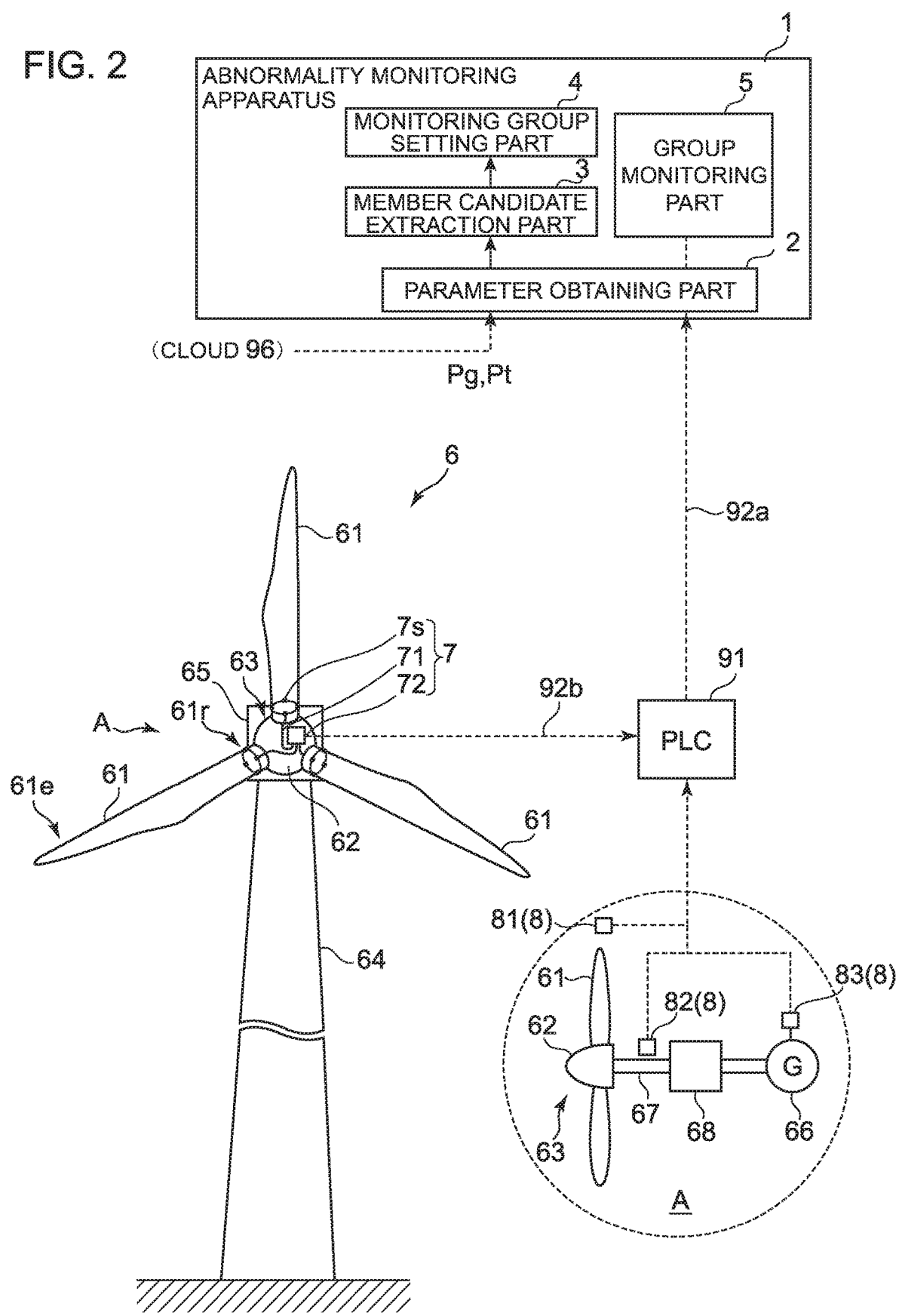
FIG. 2 is a schematic diagram of an abnormality monitoring apparatus of a wind farm according to an embodiment of the present invention.
Figure 4:
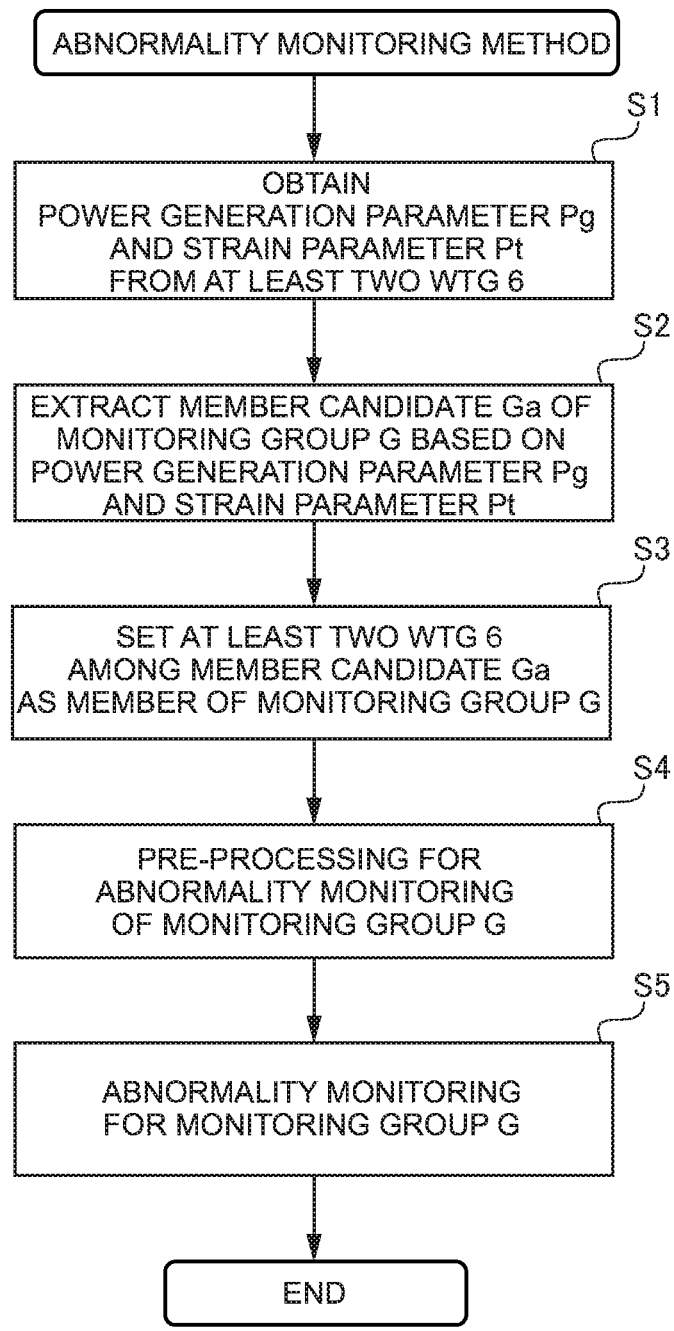
FIG. 4 is a flowchart showing an abnormality monitoring method for a wind farm according to an embodiment of the present invention, showing the flow related to setting of the monitoring group.

FIG. 1 is a schematic diagram of a monitoring system of a wind farm 9 according to an embodiment of the present invention. FIG. 2 is a schematic diagram of an abnormality monitoring apparatus 1 of a wind farm 9 according to an embodiment of the present invention. FIG. 3 is a diagram showing an image of an evaluation result of a correlation coefficient $r_{xy}$ of a plurality of wind turbine power generating apparatuses 6 according to an embodiment of the present invention. FIG. 4 is a flowchart showing an abnormality monitoring method for a wind farm 9 according to an embodiment of the present invention, showing the flow related to setting of the monitoring group G.

As shown in FIG. 1, a monitoring system of the wind farm 9 is a system for monitoring the wind farm 9 including a plurality of wind turbine power generating apparatuses 6, and includes at least one remote monitoring control device 94 (supervisory control and data acquisition (SCADA) server) connected to at least one wind turbine power generating apparatus 6, and an abnormality monitoring apparatus 1 of the wind farm 9 (hereinafter, also referred to as the abnormality monitoring apparatus 1). As shown in FIG. 1, the remote monitoring control device 94 is connected to each of the plurality of wind turbine power generating apparatuses 6 constituting the wind farm 9. The operational condition of each wind turbine power generating apparatus 6 can be monitored remotely by using the remote monitoring control device 94. The number of remote monitoring control device 94 may be determined depending on the size of the wind farm 9, for instance. In the embodiment shown in FIG. 1, a plurality of (seven) remote monitoring control devices 94 are provided. Further, each wind turbine power generating apparatus 6 is connected to one of the remote monitoring control devices 94 via a communication network, and thereby the plurality of remote monitoring control devices 94 are configured to monitor different wind turbine power generating apparatuses 6 from one another.

Furthermore, in the embodiment shown in FIG. 1, the plurality of remote monitoring control devices 94 each send information related to the operational condition (e.g. power generation parameter Pg and strain parameter Pt described below), to a server 95 connected to a cloud 96 on the Internet. Further, the server 95 stores the above information received from the plurality of remote monitoring control devices 94 on the cloud 96. Thus, through access to the cloud 96 from the owner or the manufacturer's office of the wind farm 9 (wind turbine power generating apparatuses 6), it is possible to check the above information related to the respective remote monitoring control devices 94 collectively. Similarly, through access to a remote monitoring control device 94, it is possible to check the above information related to the wind turbine power generating apparatus 6 connected to the accessed remote monitoring control device 94.

Meanwhile, as shown in FIG. 2, each wind turbine power generating apparatus 6 (wind turbine) includes a wind turbine rotor 63 including a plurality of (three in FIG. 2) wind turbine blades 61 and a hub 62 with the wind turbine blades 61 mounted thereto. The wind turbine rotor 63 is disposed on an upper portion of a tower 64 and is rotatably supported to a nacelle 65 supported to the tower 64. The wind turbine rotor 63 including the wind turbine blades 61 rotates as the wind turbine blades 61 receive wind. Furthermore, as shown in the enlarged view A shown in FIG. 2, the nacelle 65 houses a generator 66 and a power transmission mechanism for transmitting rotation of the wind turbine rotor 63 to the generator 66. The wind turbine power generating apparatus is configured such that rotation energy transmitted to the generator 66 via the power transmission mechanism from the wind turbine rotor 63 is converted into electric energy by the generator 66. It is sufficient if at least one wind turbine 61 is mounted to the hub 62. In the embodiment shown in FIG. 2, the power transmission mechanism includes a main shaft 67 connected to the hub 62, and a drive train 68 connected to the main shaft 67 and the generator 66 between the wind turbine rotor 63 and the generator 66. The drive train 68 may be a gear kind speed increasing unit, or a hydraulic transmission. Alternatively, the drive train 68 may have a configuration in which the wind turbine rotor 63 and the generator 66 are coupled directly (not shown).

Furthermore, each wind turbine power generating apparatus 6 includes a power generation parameter measurement sensor 8 for measuring the power generation parameter Pg (see FIG. 2). The power generation parameter Pg is an index which shows a strong correlation to a power generation condition, such as wind velocity, rotor rotation speed, and power generation amount, for instance, and includes at least one kind of parameter P from among wind velocity, power generation amount, the rotor rotation speed. In the embodiment shown in FIG. 2, the power generation parameter Pg includes the following three kinds of parameter P: wind velocity, power generation amount, and rotor rotation speed. Thus, as shown in the enlarged view A in FIG. 2, the three kinds of parameter P are measured respectively by using a wind velocity sensor 81 (anemometer) for measuring the wind velocity in the vicinity of the wind turbine rotor 63, a rotation-speed sensor 82 for detecting the rotation speed (rotor rotation speed) of the wind turbine rotor 63, and a power generation sensor 83 for detecting the power generation amount of the generator 66, mounted to each wind turbine power generating apparatus 6.

In some other embodiments, if the power generation parameter Pg include other parameters P such as blade pitch angle, the parameters Pg are measured respectively by using a pitch angle sensor (not shown) for detecting the pitch angle of the wind turbine blade 61 of the wind turbine rotor 63, or another sensor for measuring the other parameter P, provided for the wind turbine power generating apparatus 6. Furthermore, each wind turbine power generating apparatus 6 may further include an external environment measurement sensor for measuring the surrounding external environment, such as an external temperature sensor (not shown) mounted to the wind turbine power generating apparatus 6 or in the vicinity thereof.

Similarly, each wind turbine power generating apparatus includes a sensor for measuring a strain parameter Pt (hereinafter, also referred to as a strain parameter measurement sensor 7s). As shown in FIG. 2, in each wind turbine power generating apparatus 6, at least one strain parameter measurement sensor 7s is mounted to at least one of the wind turbine blades 61. The strain parameter Pt is an index showing a strong correlation to the strain amount of the wind turbine blade 61, and may be the strain amount itself, or a measurement value measured as a strain amount by the fiber-optic sensor 7 which is also affected by temperature, as described below. Furthermore, the strain parameter Pt may be a parameter calculated on the basis of the above strain amount of the wind turbine blade 61, such as load, moment, or the like derived from the strain amount. The strain amount or the parameter based on the above strain amount changes periodically in response to rotation of the wind turbine blade 61. The strain parameter Pt may be an amplitude value of the periodically-changing parameter, or a wavelength fluctuation index indicating the fluctuation amount of the wavelength of reflection light from the sensor part of the fiber-optic sensor 7. The wavelength fluctuation index is an index indicating the fluctuation amount of the wavelength obtained by the temporal change of the wavelength of reflection light from the sensor part. More specifically, if the reflection light changes from $\lambda 1$ to $\lambda 2$ between the two different times t1 and t2 (t1<t2), the fluctuation amount of the wavelength (wavelength fluctuation index) is $\lambda 2-\lambda 1$. The fluctuation amount of the wavelength is related to the strain amount, and the wavelength of reflection light normally depends on strain and temperature at the sensor part. Nevertheless, in such a short period as the rotational period of the wind turbine rotor 63 (normally, about four to seven minutes) and the above sampling interval, the temperature of the sensor part may be regarded as invariable, and thus the change amount of strain in the period (t1 to t2) depends (in proportion) to the fluctuation amount of the wavelength. Furthermore, the strain parameter Pt may be combination of at least one of the above parameters.

In the embodiment shown in FIG. 2, the same number of strain parameter measurement sensors 7s are mounted to each of the plurality of wind turbine blades 61 of one wind turbine power generating apparatus 6. Thus, provided that $n(n \geq 1)$ is the number of wind turbine blades 61 and $m(m \geq 1)$ is the number of strain parameter measurement sensors 7s mounted to one wind turbine blade 61, the number of strain parameter measurement sensors 7s mounted to the wind turbine power generating apparatus 6 is n×m. However, the present invention is not limited to the present embodiment. In some embodiments, the number of strain parameter measurement sensors 7s mounted to each of the plurality of wind turbine blades 61 may not necessarily be the same, and there may be one or more wind turbine blade 61 without the strain parameter measurement sensors 7s.

More specifically, in the embodiment shown in FIG. 2, four strain parameter measurement sensors 7s are mounted, at intervals of 90°, to the wall surface of the blade root portion 61r having a substantially-circular cross-section, of each of the three wind turbine blades 61. Specifically, four strain parameter measurement sensors 7s are mounted to the wall surface of the blade root portion 61r, at the high pressure (HP) side, the trailing edge (TE) side, the low pressure (LP) side, and the leading edge (LE) side. Further, when strain occurs in the blade root portion 61r, each strain parameter measurement sensor 7s measures the strain parameter Pt corresponding to the strain occurring at the attachment position. In some other embodiment, the strain parameter measurement sensor 7s may be positioned in a position different from the blade root portion 61r, such as the tip end portion 61e of the wind turbine blade 61. One of more strain parameter measurement sensors 71 may be mounted to each of the blade root portion 61r and the tip end portion 61e, for instance.

Furthermore, in the embodiment shown in FIG. 2, each of the strain parameter measurement sensors 7s mounted to the above described wind turbine blade 61 includes a sensor part such as a grating (Fiber Bragg Grating; FBG) formed on the optic fiber 71 of the fiber-optic sensor 7. Generally, the fiber-optic sensor 7 includes, as a basic configuration, a light source which emits light (not shown), an optic fiber 71 for transmitting light from the light source, at least one sensor part (strain parameter measurement sensor 7s) formed distanced from the optic fiber 71, and a light receiving device (not shown) for converting light (light characteristics) detected by receiving light from the optic fiber 71 into electric signals. In the present embodiment, in the light-source/signal processing unit 72 connected to the optic fiber 71, along with the above light source and the light receiving device, a signal processing device for processing electric signals inputted from the light receiving device (not shown) is accommodated. The signal processing device processes electric signals from the light receiving device on the basis of the information not affected by the external environment, such as light traveling speed difference, frequency, and wavelength, and thereby obtains the measurement value obtained by the strain parameter measurement sensor 7s, and turns the measurement value into data in a predetermined period such as 50 ms. In some other embodiments, each of the strain parameter measurement sensors 7s may be another kind of sensor, such as a strain gauge.

Furthermore, the strain parameter Pt measured by the strain parameter measurement sensor 7s mounted to the wind turbine blade 61, the power generation parameter Pg measured by the power generation parameter measurement sensor 8, and the measurement value obtained by the sensor for measuring the external environment such as the ambient temperature sensor (not shown) are input into the abnormality monitoring apparatus 1 of the wind turbine power generating apparatus 6. In the embodiment shown in FIG. 2, the above described light-source/signal processing unit 72 is connected to the programmable logic controller (PLC) 91 via the second communication line 92b, and all the measurement values measured by the strain parameter measurement sensors 7s mounted to the respective wind turbine power generating apparatuses 6 at the same time (the same timing) are sent to the abnormality monitoring apparatus 1 connected via the first communication line 92a, in a predetermined period (e.g. 50 Ms). At this time, the communication processing load may be reduced by increasing the transmission period (e.g. 100 Ms) from the PLC 91 to the abnormality monitoring apparatus 1 compared to the input period of the measurement value from the light-source/signal processing unit 72. In the embodiment shown in FIGS. 1 and 2, the first communication line 92a between the abnormality monitoring apparatus 1 and the PLC 91 may include a communication network such as the Internet. Furthermore, the first communication line 92a and the second communication line 92b may each include a wireless line, a wire line, or both.

In the wind farm 9 having the above configuration, the abnormality monitoring apparatus 1 of the wind farm 9 performs abnormality monitoring on the basis of information related to the operational condition transmitted from the plurality of wind turbine power generating apparatuses 6. In the embodiment shown in FIG. 1, the abnormality monitoring apparatus 1 is connected to the cloud 96. However, in some other embodiments, the abnormality monitoring apparatus 1 may be connected to one of the remote monitoring control device 94, the server 95, or the cloud 96. Accordingly, the plurality of wind turbine power generating apparatuses 6 are connected to the abnormality monitoring apparatus 1 via the communication network (the first communication line 92a and the second communication line 92b). Thus, the abnormality monitoring apparatus 1 can perform real-time abnormality monitoring where two or more wind turbine power generating apparatuses 6 (monitoring group G) are monitored, as described below.

Hereinafter, the abnormality monitoring apparatus 1 of the wind farm 9 will be described with reference to FIG. 2.

The abnormality monitoring apparatus 1 of the wind farm 9 is a device for performing abnormality monitoring on the monitoring group G including at least two (having two or more members) wind turbine power generating apparatuses 6 of the wind farm 9. As shown in FIG. 2, the abnormality monitoring apparatus 1 includes a parameter obtaining part 2, a member candidate extraction part 3, a monitoring group setting part 4, and a group monitoring part 5. Further, the abnormality monitoring apparatus 1 is configured to set a monitoring group G through process by the member candidate extraction part 3 and the monitoring group setting part 4 on the basis of the information obtained by the above parameter obtaining part 2, and then perform monitoring on the monitoring group G with the group monitoring part 5.

Each functional part of the abnormality monitoring apparatus 1 will now be described.

The abnormality monitoring apparatus 1 includes a computer, and includes a CPU (processor, not depicted), a memory such as ROM and RAM, an auxiliary storage device (storage device M), and an external communication interface. The CPU operates (e.g. calculates data) in accordance with program instructions (abnormality monitoring program) loaded to a main storage device, and thereby the above functional parts are implemented.

The parameter obtaining part 2 obtains the power generation parameter Pg (described above) related to power generation of the wind turbine power generating apparatus 6, and the strain parameter Pt (described above) measured by the strain parameter measurement sensor 7s mounted to the wind turbine blade 61 of the wind turbine power generating apparatus 6, from at least two (N) of the plurality of (Na) wind turbine power generating apparatuses 6 constituting the wind farm 9. This is, as described below, to evaluate the correlation between the different kinds of power generation parameter Pg and strain parameter Pt among the at least two wind turbine power generating apparatuses 6. In the embodiment shown in FIG. 2, the parameter obtaining part 2 is configured to obtain previous data of the two parameters P (Pg, Pt) measured in past, through access to the cloud 96 or the like. The data to be obtained may be learning data L described below. At this time, the parameter obtaining part 2 may obtain two parameters P from each of the entire (Na) wind turbine power generating apparatuses 6 of the wind farm 9, or from a plurality of (N) wind turbine power generating apparatuses 6 selected from the entire wind turbine power generating apparatuses 6 of the wind farm 9. That is, provided that Na is the total number of the wind turbine power generating apparatuses 6 of the wind farm 9 (Na≥2) and N is the total number of the wind turbine power generating apparatuses 6 from which the parameter obtaining part 2 is to obtain parameters (N≥2), N≤$N_a$ is satisfied.

More specifically, if the power generation parameter Pg includes the three kinds of parameter P, namely wind velocity, power generation amount, rotor rotation speed, the parameter obtaining part 2 obtains a plurality of data (measurement values) obtained through measurement at a plurality of measurement timings at the same time of day so as to the measurement timings from being considerably different among the wind turbine power generating apparatuses 6, for each of wind velocity, power generation amount, and rotor rotation speed of each wind turbine power generating apparatus 6. Similarly, for the strain parameter Pt, for instance, for each kind of strain parameter measurement sensor 7s classified by the attachment position or the like, such as the LP side and the HP side, a plurality of data obtained by measuring at a plurality of measurement timings are obtained at the same time of day so as to prevent the measurement timings from being considerably different among the wind turbine power generating apparatuses 6. The previous data includes a plurality of data obtained as described above. The plurality of data (previous data) related to the power generation parameter Pg and the strain parameter Pt may include data over a predetermined period, such as a predetermined number of hours, days, and months, or may include data in a predetermined period extracted under a predetermined condition such as a time range where the power generation parameter Pg reaches its maximum.

Furthermore, with regard to the strain parameter Pt, in a case where the plurality of strain parameter measurement sensors 7s of each wind turbine power generating apparatus 6 measure the strain parameter Pt, the parameter obtaining part 2 may obtain all of the measurement values obtained by the plurality of strain parameter measurement sensor 7s of each wind turbine power generating apparatus 6, or may obtain the measurement values of a part of the plurality of strain parameter measurement sensors 7s, such as the measurement values at the LP side of one of the plurality of wind turbine blades 61. That is, n×m strain parameter measurement sensors 7s are mounted to one wind turbine power generating apparatus 6 as described above, and thus the strain parameter Pt obtained by the parameter obtaining part 2 is a set of n×m×N measurement values at the maximum. When the data is obtained from only a part of the plurality of strain parameter measurement sensors 7s, the parameter obtaining part 2 obtains only one kind of measurement value (e.g. The measurement value of the LP side of the first blade) from the wind turbine power generating apparatus 6 at the minimum, and thus the strain parameter Pt is a set of N measurement values at the minimum.

The member candidate extraction part 3 extracts, as the member candidates $g_a$ of the monitoring group, at least two wind turbine power generating apparatuses 6 in which the correlation between the power generation parameters Pg of the at least two (N) wind turbine power generating apparatuses 6 obtained by the parameter obtaining part 2 is not smaller than the first predetermined value, and the correlation between the strain parameters Pt is not smaller than the second predetermined value. The above first predetermined value and the second predetermined value may be the same, or different. That is, the member candidate extraction part 3 obtains the above correlation by using previous data obtained by the parameter obtaining part 2. This is based on the findings of the present inventors that, with the monitoring group G including at least two wind turbine power generating apparatuses 6 showing a strong correlation between not only the power generation parameters Pg but also the strain parameters Pt, it is possible to suppress (reduce) influence of individual variability of sensors on the abnormality detection accuracy in abnormality monitoring.

That is, a measurement value of a strain parameter measurement sensor 7s mounted to the wind turbine blade 61 for measuring a strain amount, for instance, is under influence of a mounted state of a sensor to the wind turbine blade 61 and the external environment. The present inventors found that the level of the influence differs among the sensors and there is individual variability. For instance, a fiber-optic sensor 7 measures a strain amount by utilizing a change in the optic characteristics of reflection light from a grating (FBG) constituting the sensor part (7s) in response to a change the refractive index and the grating spacing of the grating in response to the strain amount. The refractive index and spacing of the grating change depending not only the strain amount but also the ambient temperature, and the change due to the temperature differs among individual sensors. Thus, by forming the monitoring group G with at least two wind turbine power generating apparatuses 6 satisfying the above condition, it is possible to suppress influence of individual variability of sensors on abnormality monitoring accuracy, in the monitoring group G.

Herein, the correlation between the power generation parameter Pg and the correlation of the strain parameter Pt may be evaluated by a correlation coefficient. Generally, provided that Sx, Sy are standard deviations of two variate groups x, y, respectively, and $S_{xy}$ is the covariance of the variate groups x, y, the correlation coefficient is calculated as follows: $r_{xy}=S_{xy}/(S_x \times S_y)$. In the present invention, the variate groups x, y are sets of measurement values of some kind of parameter P related to each of the two wind turbine power generating apparatuses 6 selected from the plurality of (N) wind turbine power generating apparatuses 6. Thus, the member candidate extraction part 3 obtains $_NC_2$ kinds of correlation coefficients $r_{xy}$, which is a set number for selecting two from N wind turbine power generating apparatuses 6, for each kind of parameter P. Then, the member candidate extraction part 3 extracts, as the member candidates $g_a$, a set of wind turbine power generating apparatuses 6 in which all of the calculation results of the $_NC_2$ kinds of correlation coefficients $r_{xy}$ calculated for each kind of power generation parameter Pg are not smaller than the first predetermined value, and all of the calculation results of the $_NC_2$ kinds of correlation coefficient $r_{xy}$ calculated for each of (each kind of) strain parameter measurement sensors 7s are not smaller than the predetermined second value.

For instance, provided that, in the previous data, the power generation parameter Pg includes wind velocity and power generation amount, and the strain parameter Pt includes the measurement value of the strain parameter measurement sensor 7s at the LP side of the wind turbine blade 61 (first blade), FIG. 3 shows a result of calculation of the correlation coefficient $r_{xy}$ related to each of the peak value of the strain amount calculated on the basis of wind velocity, power generation amount, and the measurement value at LP side, of each of the N wind turbine power generating apparatuses 6. Furthermore, the first predetermined value and the second predetermine value are both a predetermined value V1 (e.g. 0.8) determined such that wind turbine power generating apparatuses showing a strong correlation can be extractable. Furthermore, in the example shown in FIG. 3, only the correlation coefficients $r_{ac}$ of the strain parameter Pt between the first wind turbine power generating apparatus 6a and the third wind turbine power generating apparatus 6c is below the predetermined value V1 (the second predetermined value), and all of the other correlation coefficients $r_{xy}$ are over the predetermined value V1. Thus, in the example shown in FIG. 3, from the member candidates $g_a$ of the monitoring group G, at least one of the first wind turbine power generating apparatus 6a or the third wind turbine power generating apparatus 6c is excluded, from among the N wind turbine power generating apparatuses 6.

The monitoring group setting part 4 sets, as members of the monitoring group G, at least two wind turbine power generating apparatuses 6 of the member candidates $g_a$ extracted by the member candidate extraction part 3. That is, the monitoring group G may include all of the wind turbine power generating apparatuses 6 in the member candidates $g_a$ as members, or may include wind turbine power generating apparatuses 6 satisfying a condition as members from the wind turbine power generating apparatuses 6 included in the member candidates $g_a$. Provided that $N_g$ is the number of wind turbine power generating apparatuses 6 constituting the monitoring group G, $N_g \leq N$ is satisfied.

Meanwhile, the group monitoring part 5 performs, after the above processes by the parameter obtaining part 2 and the member candidate extraction part 3, abnormality monitoring on the monitoring group G set with the group monitoring part 5. The abnormality monitoring will be described below in detail.

The abnormality monitoring method of the wind farm 9 corresponding to the process of the abnormality monitoring apparatus 1 (hereinafter, also referred to as abnormality monitoring method) will be described with reference to FIG. 4.

As shown in FIG. 4, the abnormality monitoring method includes a parameter obtaining step (S1), a member candidate extraction step (S2), a monitoring group setting step (S3), and a group monitoring step (S5). After setting the monitoring group G via the member candidate extraction step (S2) and the monitoring group setting step (S3) on the basis of the information obtained in the parameter obtaining step (S1), the group monitoring step (S5) of monitoring the monitoring group G is performed. The present abnormality monitoring method may be performed by the abnormality monitoring apparatus 1, or may be performed manually by using a computer, for instance. The present abnormality monitoring method will be described in accordance with the flow of FIG. 4.

In steps S1 of FIG. 4, the parameter obtaining step is performed. The parameter obtaining step (S1) is a step of obtaining the power generation parameter Pg related to power generation of the wind turbine power generating apparatus 6, and the strain parameter Pt measured by the strain parameter measurement sensor 7s mounted to the wind turbine blade 61 of the wind turbine power generating apparatus 6, from at least two (N) of the plurality of (Na) wind turbine power generating apparatuses 6 constituting the wind farm 9. Step S1 is similar to the process performed by the above described parameter obtaining part 2, and thus not described here in detail.

In step S2, the member candidate extraction step is performed. The member candidate extraction step (S2) is a step of, as the member candidates $g_a$ of the monitoring group, extracting at least two wind turbine power generating apparatuses 6 in which the correlation of the power generation parameters Pg of the at least two (N) wind turbine power generating apparatuses 6 obtained in the parameter obtaining step (S1) is not smaller than the first predetermined value, and the correlation of the strain parameters Pt is not smaller than the second predetermined value. Step S2 is similar to the process performed by the above described member candidate extraction part 3, and thus not described here in detail.

In step S3, the monitoring group setting step is performed. The monitoring group setting part is a step of setting, as members of the monitoring group G, at least two wind turbine power generating apparatuses 6 of the member candidates $g_a$. Step S3 is similar to the process performed by the above described monitoring group setting part 4, and thus not described here in detail.

Then, in step S4, pre-processing (preparation) is performed, to prepare for abnormality monitoring on the monitoring group G set in the previous step. The pr-processing for abnormal monitoring may be machine learning described below. Alternatively, the pre-processing may be merely obtaining information of the monitoring group G.

Further, in the group monitoring step (S5), the group monitoring step is performed. The group monitoring step (S5) is a step of performing abnormality monitoring on the monitoring group G set in the monitoring group setting part (S3). Step S5 is similar to the process (described below) performed by the above described group monitoring part 5, and thus not described here in detail.

With the above configuration, the monitoring group G includes at least two wind turbine power generating apparatuses 6 in which correlation is strong not only among the power generation parameters Pg (e.g. correlation coefficient $r_{xy}$), but also the strain parameters Pt. The power generation parameter Pg is an index which shows a strong correlation to a power generation condition, such as wind velocity, rotor rotation speed, and power generation amount, for instance. The strain parameter Pt is an index showing a strong correlation to the strain amount of the wind turbine blade 61. That is, the monitoring group includes at least two wind turbine power generating apparatuses in which, not only the correlation of the power generation condition is strong, but the correlation of individual variability among sensors (strain parameter measurement sensors 7s) mounted thereto is also strong. Thus, the individual variability of sensors in the monitoring group is also similar. Accordingly, in the monitoring group G, it is possible to suppress wrong detection of an abnormality due to deviance, from the normal value, of the measurement value of a sensor having a great individual variability due to a change in the external environment, and to enhance the accuracy of abnormality monitoring on the monitoring group G including at least two wind turbine power generating apparatuses 6, thus improving the reliability of the abnormality monitoring.

Figure 5:
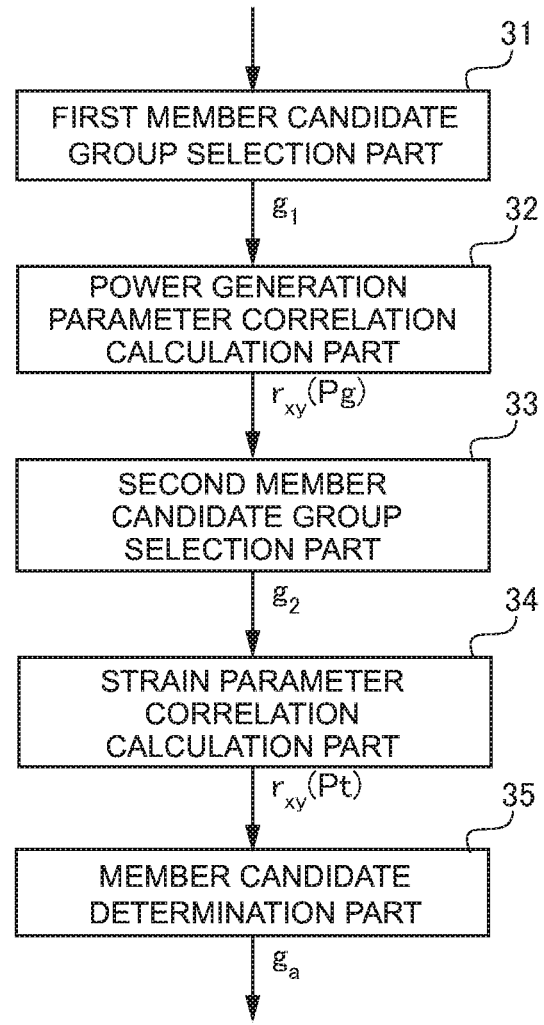
FIG. 5 is a block diagram showing the function of a member candidate extraction part according to an embodiment of the present invention.
Figure 6:
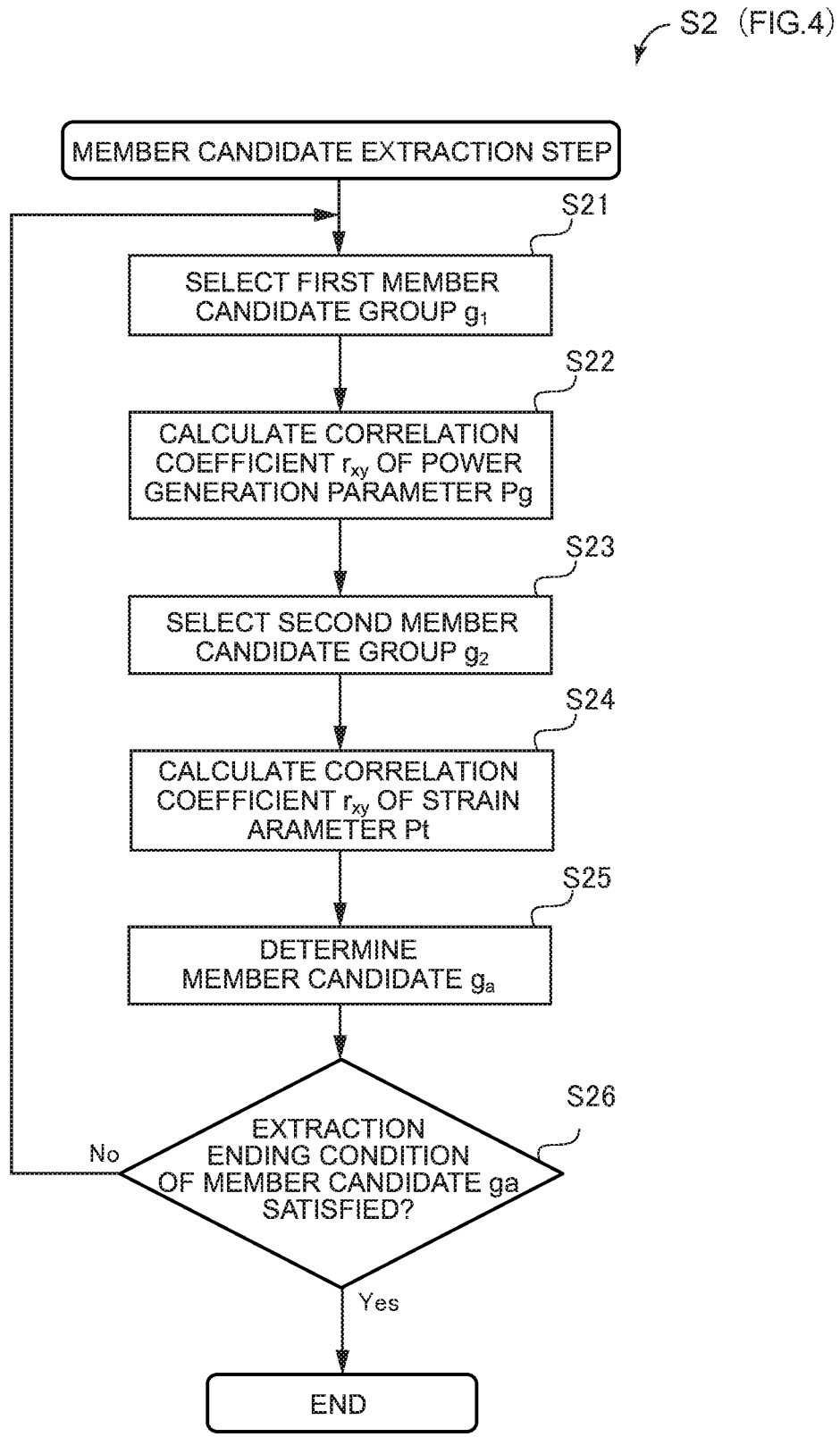
FIG. 6 is a flowchart showing in detail a member candidate extraction step according to an embodiment of the present invention.

Next, some embodiments related to a process of the above described member candidate extraction part 3 state will be described with reference to FIGS. 5 and 6. FIG. 5 is a block diagram showing the function of a member candidate extraction part 3 according to an embodiment of the present invention. FIG. 6 is a flowchart showing in detail a member candidate (S2) step according to an embodiment of the present invention.

In some embodiments, as shown in FIG. 5, the member candidate extraction part 3 may include a first member candidate group selection part 31, a power generation parameter correlation calculation part 32, a second member candidate group selection part 33, a strain parameter correlation calculation part 34, and a member candidate determination part 35. Each functional part of the member candidate extraction part 3 will now be described.

The first member candidate group selection part 31 selects the first member candidate group $g_1$ including at least two of the plurality of (Na) wind turbine power generating apparatuses 6. That is, a plurality of wind turbine power generating apparatuses 6 are selected as the first member candidate group $g_1$, from among Na wind turbine power generating apparatuses 6 constituting the wind farm 9, which are arranged geographically dispersed. For instance, the first member candidate group $g_1$ may include wind turbine power generating apparatuses 6 geographically adjacent to each other, or may include wind turbine power generating apparatuses 6 which are not geographically adjacent but have similar predetermined condition such as wind power. Alternatively, the first member candidate group $g_1$ may include a predetermine number, which is not greater than Na, of randomly selected wind turbine power generating apparatuses 6. Provided that $Ng_1$ is the number in the first member candidate group $g_1$, $N \leq Ng_1 \leq N_a$ is satisfied.

The power generation parameter correlation calculation part 32 obtains the correlation of the power generation parameter Pg among the wind turbine power generating apparatuses 6 belonging to the first member candidate group $g_1$. The power generation parameter correlation calculation part 32 may calculate the correlation coefficient $r_{xy}$ as described above (see FIG. 3). Furthermore, in the embodiment shown in FIG. 5, the power generation parameter correlation calculation part 32 is connected to the first member candidate group selection part 31, and thus receives information of the first member candidate group $g_1$ selected by the first member candidate group selection part 31.

The second member candidate group selection part 33 selects, from among the first member candidate group $g_1$, the second member candidate group $g_2$ including at least two wind turbine power generating apparatuses 6 in which the correlation obtained by the power generation parameter correlation calculation part 32 is not smaller than the first predetermined value. Provided that $Ng_2$ is the number of the second member candidate group $g_2$, $N \leq Ng_2 \leq Ng_1$ is satisfied. In the embodiment shown in FIG. 5, the second member candidate group selection part 33 is connected to the power generation parameter correlation calculation part 32, and thereby receives information of the correlation (correlation coefficient $r_{xy}$) related to the power generation parameter Pg obtained by the power generation parameter correlation calculation part 32.

The strain parameter correlation calculation part 34 obtains the correlation of the strain parameter Pt among the wind turbine power generating apparatuses 6 belonging to the second member candidate group $g_2$. The strain parameter correlation calculation part 34 may calculate the correlation coefficient $r_{xy}$ as described above (see FIG. 3). In the embodiment shown in FIG. 5, the strain parameter correlation calculation part 34 is connected to the second member candidate group selection part 33, and thus receives information of the second member candidate group $g_2$ selected by the second member candidate group selection part 33.

The member candidate determination part 35 determines, from among the second member candidate group $g_2$, wind turbine power generating apparatuses 6 in which the correlation obtained by the strain parameter correlation calculation part 34 is not smaller than the second predetermined value, as the member candidates $g_a$. That is, the member candidates $g_a$ determined as described above make up the member candidate group including at least two wind turbine power generating apparatuses 6. Provided that $N_{ga}$ is the number of the member candidate group, $N \leq N_{ga} \leq N_a$ is satisfied. In the embodiment shown in FIG. 5, the member candidate determination part 35 is connected to the strain parameter correlation calculation part 34, and thereby receives information of the correlation (correlation coefficient $r_{xy}$) related to the strain parameter Pt obtained by the strain parameter correlation calculation part 34.

The processing result by the member candidate extraction part 3 having the above configuration will be described with reference to FIG. 3. When the first member candidate group selection part 31 selects N wind turbine power generating apparatuses 6, all of the correlation coefficients $r_{xy}$ of the power generation parameter Pg satisfy the first predetermined value (V1), and thus the first member candidate group $g_1$ and the second member candidate group $g_2$ are the same set. Meanwhile, only the correlation coefficient $r_{ac}$ of the strain parameter Pt between the first wind turbine power generating apparatus 6a and the third wind turbine power generating apparatus 6c is below the second predetermined value (V1). Thus, the member candidate determination part 35 excludes at least one of the first or third wind turbine power generating apparatus 6c from the member candidates ga, and determines a plurality of member candidates $g_a$ (the above member candidate group).

Furthermore, in some embodiments, the above described member candidate extraction part 3 may be configured to determine the member candidates $g_a$ by performing the above process once with the functional parts. Accordingly, it is possible to extract the member candidates $g_a$ relatively quickly without spending a great amount of time. In the present embodiment, in a case where not a single wind turbine power generating apparatus 6 is included in the member candidate $g_a$ after a single process, another first member candidate group $g_1$ different from that in this case is re-selected to determine the member candidates $g_a$.

In some embodiments, the member candidate extraction part 3 may be configured to determine the member candidates $g_a$ by repeating the above process of the above functional parts (31 to 35) once or more. Specifically, in the first time (first loop), the set of the first member candidate group $g_1$ is set to have a relatively small number of wind turbine power generating apparatuses, such as two, and the member candidates $g_a$ of the first loop are determined after process by the above functional parts. Then, a relatively small number of different wind turbine power generating apparatuses 6, such as one, is added to the member candidates $g_a$ determined in the first loop, and this set is used as the first member candidate group $g_1$ for the second loop to determine the member candidates $g_a$ of the second loop similarly.

From the third loop, another wind turbine power generating apparatuses 6 are added to the member candidates $g_a$ determined in the previous loop (e.g. in the third loop, add to the second loop), and this set is used as the first member candidate group $g_1$ of the current loop to determine the member candidates $g_a$ of the current loop through a similar process to the first loop. At this time, the member candidate extraction part 3 may end extraction of member candidates $g_a$ when an extraction ending condition is satisfied, which is at least one of the following, for instance: when there is no more wind turbine power generating apparatus 6 left in the wind farm 9 that has not been added to the first member candidate group $g_1$, or when the member candidates $g_a$ include a predetermined number of members, or when the number of loops reaches a predetermined number. Accordingly, it is possible to obtain a relatively large set of member candidates $g_a$.

Next, the member candidate extraction step (S2) corresponding to the process of the above described member candidate extraction part 3 will be described with reference to FIG. 6.

As shown in FIG. 6, the member candidate extraction step (S2) of the above described abnormality monitoring method includes: a first member candidate group selection step (S21) of selecting the above described first member candidate group $g_1$; a power generation parameter correlation calculation step (S22) of obtaining the correlation of the power generation parameter Pg among the wind turbine power generating apparatuses 6 belonging to the first member candidate group $g_1$; a second member candidate group selection step (S23) of selecting the above described member candidate group $g_2$ from among the first member candidate group $g_1$; a strain parameter correlation calculation step (S24) of obtaining the correlation of the strain parameter Pt among the wind turbine power generating apparatuses 6 belonging to the second member candidate group $g_2$; and a member candidate determination step (S25) of determining, as the member candidates ga, the wind turbine power generating apparatuses 6 in which the correlation obtained in the strain parameter correlation calculation step (S24) is not smaller than the second predetermined value, from among the second member candidate group $g_2$. Steps S21 to S25 are similar to the process performed by the above described functional parts 35 with a similar name, and thus not described here in detail.

The embodiment shown in FIG. 6 will be described. In step S21, the first member candidate group selection step is performed to select to the first member candidate group $g_1$, and in step S2, the power generation parameter correlation calculation step is performed to calculate the correlation coefficient $r_{xy}$ of the power generation parameter Pg (see FIG. 3). Next, in step S23, the Second member candidate group selection step is performed to select to the second member candidate group $g_2$, and in step S24, the strain parameter correlation calculation step is performed to calculate the correlation coefficient $r_{xy}$ of the strain parameter Pt (see FIG. 3). Then, in step S25, the member candidate determination step is performed to determine the member candidates ga. Then, in step S26, on the basis of the member candidates $g_a$ obtained in the above described step S25, it is determined whether the extraction ending condition is satisfied. If satisfied, the current flow is ended, and if not, the above described steps S21 to S25 are performed repetitively until the extraction ending condition is satisfied.

However, the present invention is not limited to the member candidate extraction step of the present embodiment. It is sufficient if the first member candidate group selection step (S21) is performed before the power generation parameter correlation calculation step (S22), and the second member candidate group selection step (S23) is performed before the strain parameter correlation calculation step (S24). The same applies to the order of process performed by the functional parts of the member candidate extraction part 3.

With the above configuration, after evaluating the correlation of the power generation parameter Pg, the correlation of the strain parameter Pt is evaluated. Accordingly, it is possible to extract at least two wind turbine power generating apparatuses 6 in which the correlation of the power generation parameter Pg and the correlation of the strain parameter Pt are strong, efficiently.

Furthermore, while the correlation of the strain parameter Pt is evaluated after evaluating the correlation of the power generation parameter Pg in the above described embodiments, in some other embodiments, the correlation of the power generation parameter Pg may be evaluated after evaluating the correlation of the strain parameter Pt. In this case, the member candidate extraction part 3 (not shown) includes: a first member candidate group selection part 31 configured to select the above described first member candidate group $g_1$; a strain parameter correlation calculation part configured to obtain the correlation of the strain parameter Pt among the wind turbine power generating apparatuses 6 belonging to the first member candidate group $g_1$; a second member candidate group selection part configured to select the above described member candidate group $g_2$ including at least two wind turbine power generating apparatuses 6 in which the correlation obtained by the strain parameter correlation calculation part is not smaller than the second predetermined value, from among the first member candidate group $g_1$; a power generation parameter correlation calculation part configured to obtain the correlation of the power generation parameter Pg among the wind turbine power generating apparatuses 6 belonging to the second member candidate group $g_2$; and a member candidate determination part configured to determine, as the member candidates ga, the wind turbine power generating apparatuses 6 in which the correlation obtained by the power generation parameter correlation calculation part is not smaller than the first predetermined value, from among the second member candidate group $g_2$. The above function parts are connected in series in the above order, for instance. Herein, the member candidate extraction step (S2) is similar to this, except that the function parts are replaced by steps.

Figure 7:
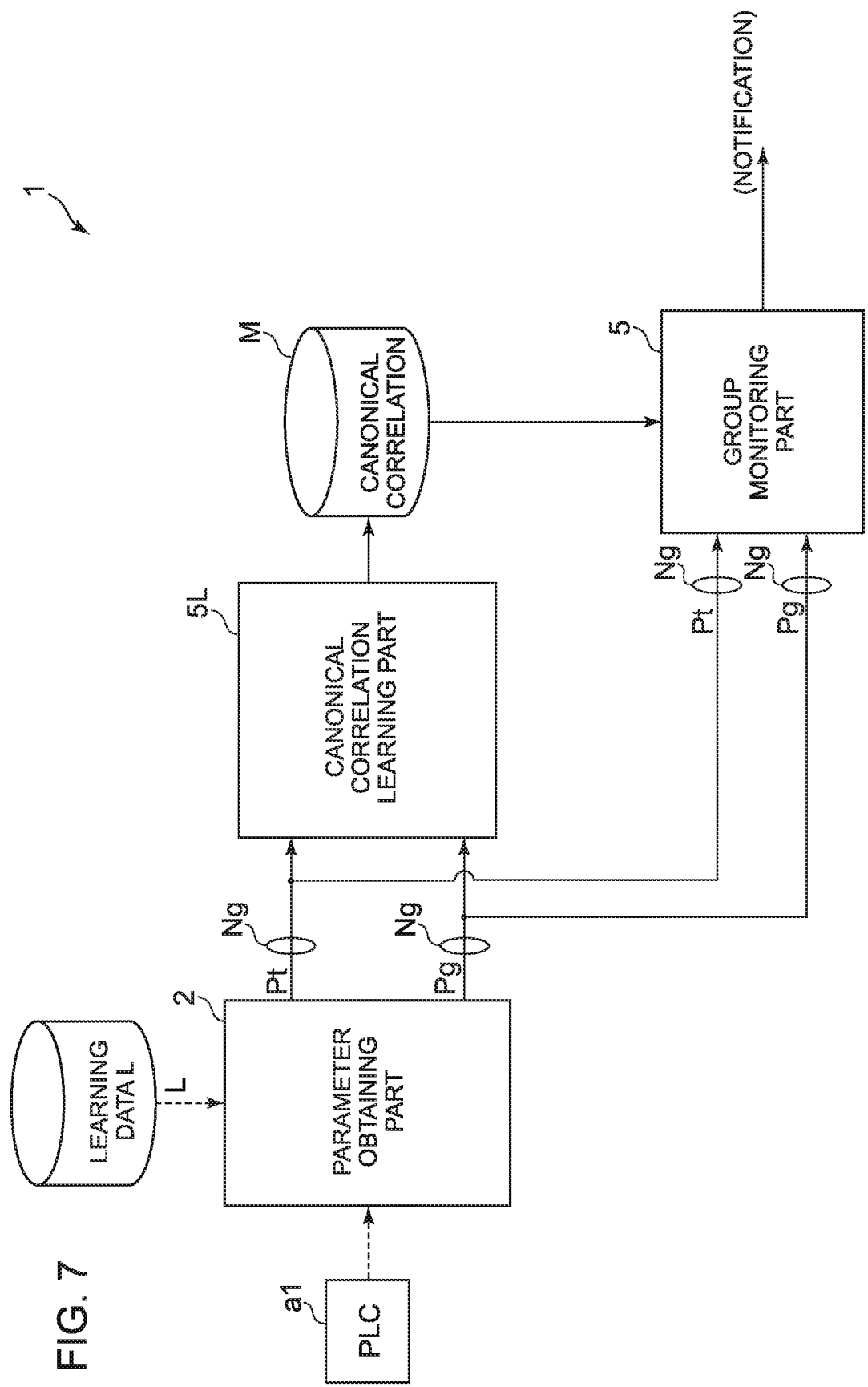
FIG. 7 is a block diagram showing the function related to abnormal monitoring of an abnormality monitoring apparatus of a wind farm according to an embodiment of the present invention.
Figure 8:
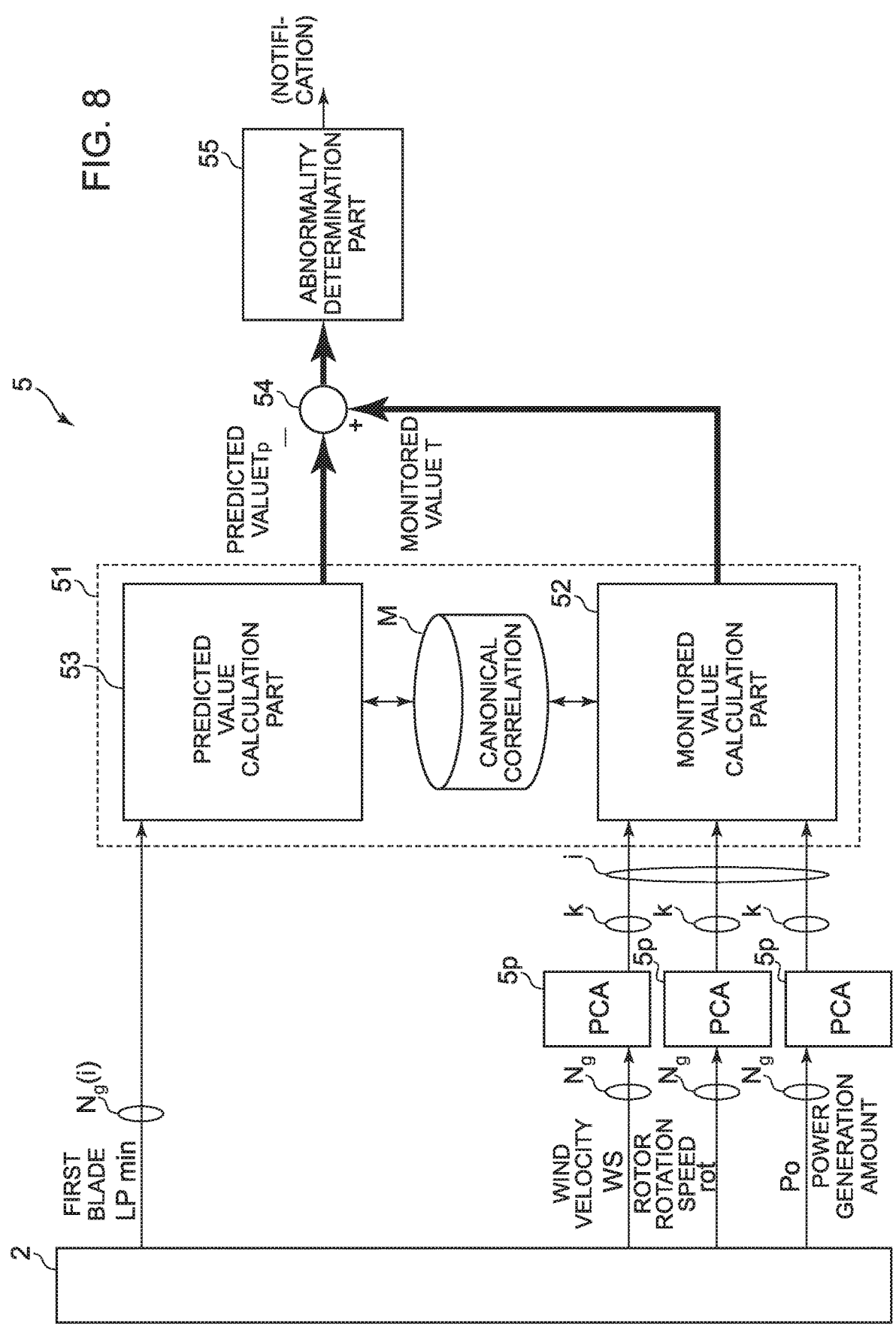
FIG. 8 is a block diagram showing the function of a group monitoring part according to an embodiment of the present invention.
Figure 9:
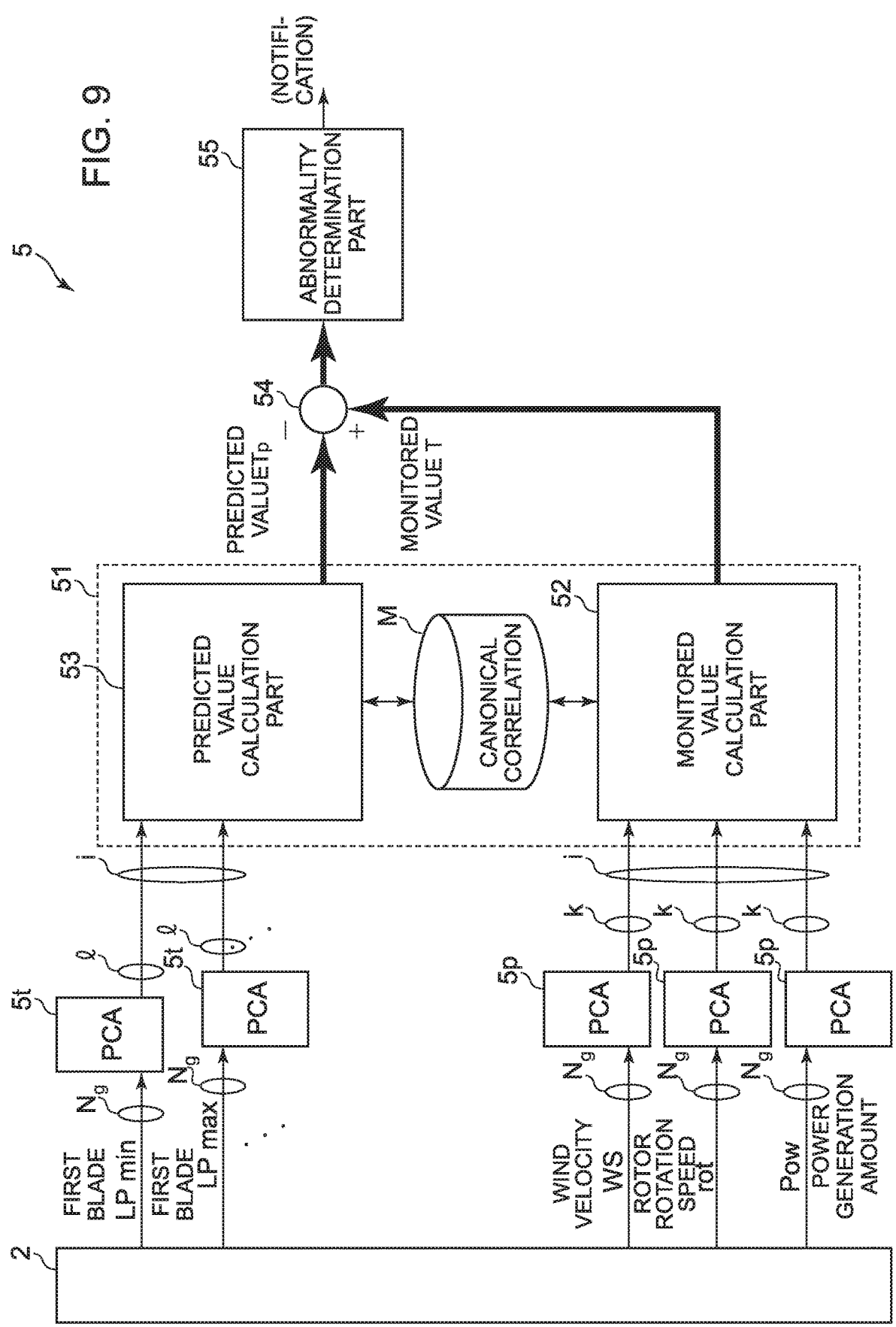
FIG. 9 is a block diagram showing the function of a group monitoring part according to an embodiment of the present invention, which performs principal component analysis of the strain parameter.
Figure 10:
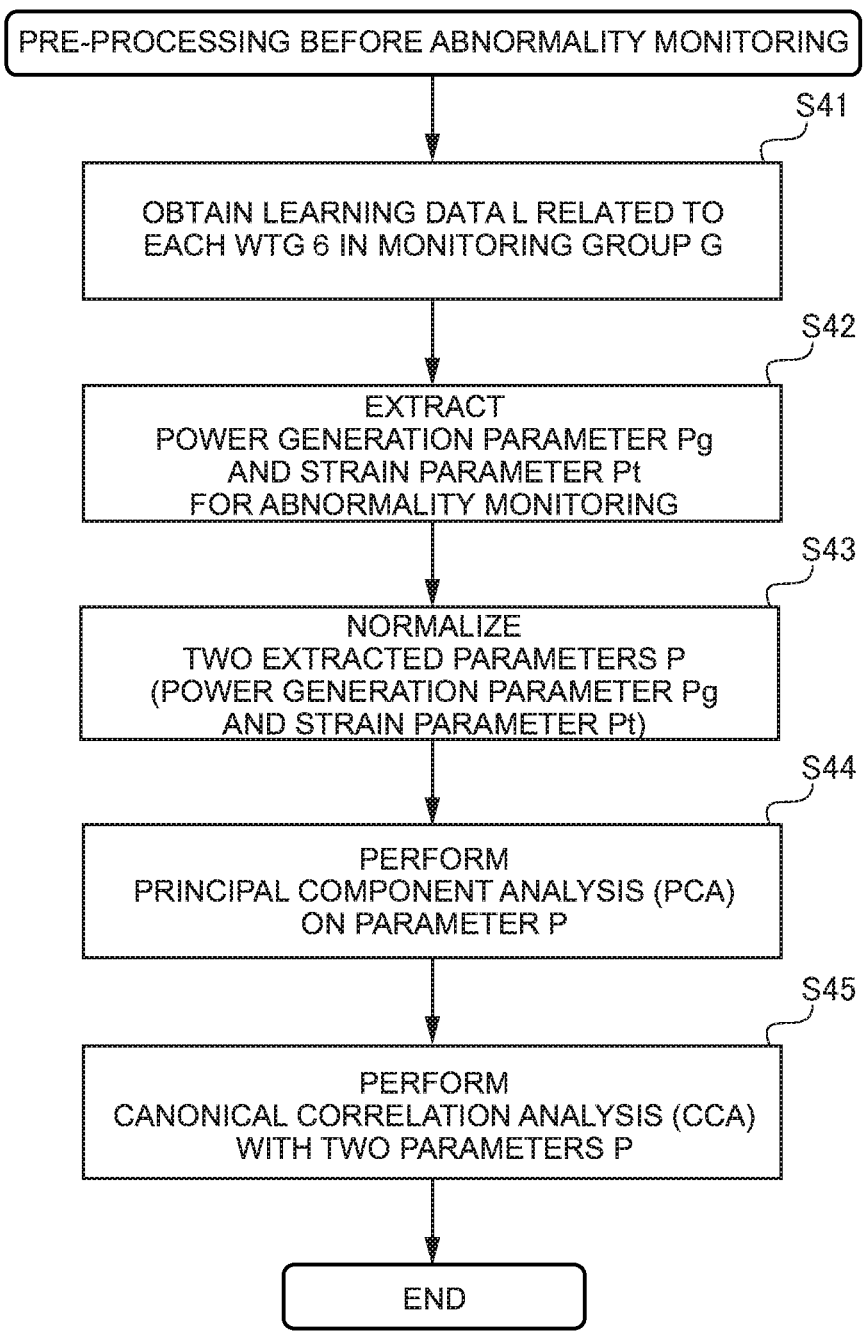
FIG. 10 is a flowchart of a pre-processing (S4 in FIG. 4) for abnormality monitoring of a monitoring group according to an embodiment of the present invention.
Figure 11:
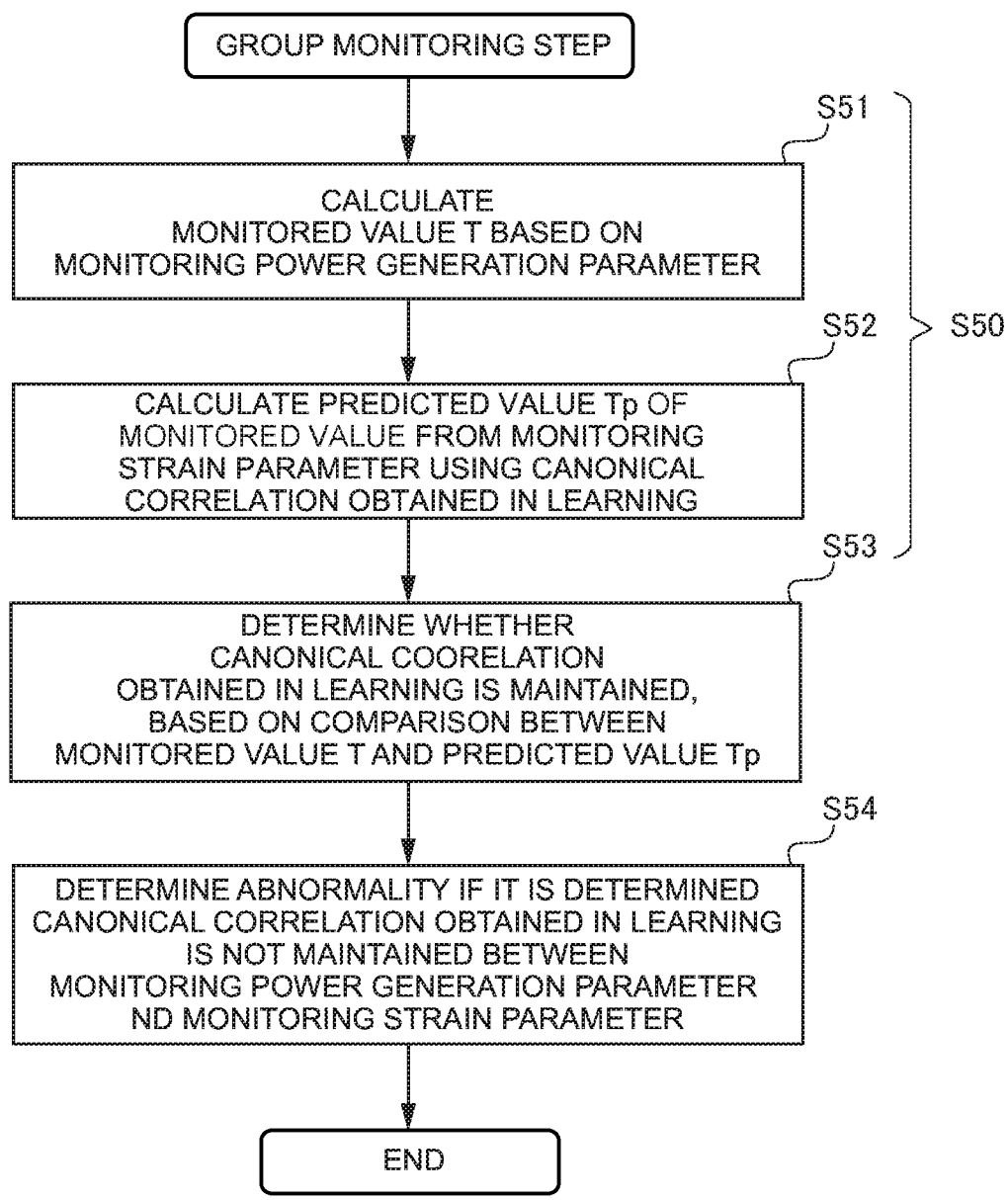
FIG. 11 is a flowchart showing a group monitoring step (S5 in FIG. 4) according to an embodiment of the present invention.

The embodiment related to setting of the monitoring group G was described above. Next, some embodiments of the details of abnormality monitoring performed by the monitoring group G will be described with reference to FIGS. 7 to 11. FIG. 7 is a block diagram showing the function related to abnormal monitoring of an abnormality monitoring apparatus 1 of a wind farm 9 according to an embodiment of the present invention. FIG. 8 is a block diagram showing the function of a group monitoring part 5 according to an embodiment of the present invention. FIG. 9 is a block diagram showing the function of a group monitoring part 5 according to an embodiment of the present invention, which performs principal component analysis of the strain parameter Pt. FIG. 10 is a flowchart of a preprocessing (S4 in FIG. 4) for abnormality monitoring of a monitoring group G according to an embodiment of the present invention. FIG. 11 is a flowchart showing a group monitoring step (S5 in FIG. 4) according to an embodiment of the present invention.

In some embodiments, the group monitoring part 5 (see FIG. 1) detects an abnormality occurring in at least one of the wind turbine power generating apparatuses 6 belonging to the monitoring group G, through determination of whether the operational state of the monitoring group G obtained by seeing the monitoring group G as a whole is different from a normal state. Accordingly, it is possible to detect an abnormality in an earlier stage, while suppressing load of abnormality monitoring. Furthermore, since an abnormality can be detected quickly, it is possible to specify the wind turbine power generating apparatuses 6 with an abnormality and address to the abnormality in an earlier stage. More specifically, as described below, the group monitoring part 5 may perform abnormality monitoring through machine learning.

First, machine learning will be described. In some embodiments, as shown in FIG. 7, the abnormality monitoring apparatus 1 further includes a canonical correlation learning part 5L configured to obtain a canonical correlation between the power generation parameter Pg and the strain parameter Pt of the wind turbine power generating apparatuses 6 belonging to the monitoring group G, in learning before performing abnormality monitoring by the group monitoring part 5. Furthermore, the group monitoring part 5 may be configured to perform abnormality monitoring on the monitoring group G on the basis of the canonical correlation obtained by the canonical correlation learning part 5L as described below. That is, learning by the canonical correlation learning part 5L (machine learning) is a process serving as the basis for the group monitoring part 5 to perform abnormality monitoring, and is performed by using learning data L in which measurement values of the power generation parameter Pg and the strain parameter Pt obtained before execution of abnormality monitoring by the group monitoring part 5 are accumulated. If the learning data includes data obtained under a condition in which it can be regarded that the normality of the wind turbine power generating apparatuses 6 belonging to the monitoring group G is ensured, such as when the monitoring group G is being used for the first time, or at the time of regular maintenance, the canonical correlation obtained by the canonical correlation learning part 5L is free from the influence at the time of abnormality, which makes it possible to achieve an even higher abnormality detection accuracy.

More specifically, the above canonical correlation is obtained by canonical correlation analysis. Generally, in canonical correlation analysis, for each of the variate groups x, y, linear combinations of all of the variates included in each variate group are generated. Specifically, provided that the i-th values (i=1, 2, . . . ) in the respective variate groups are $x_i$, $y_i$, and the i-th coefficients (canonical correlation coefficients) are $a_i$, $b_i$, and the canonical variates in the variate groups x, y are f(x), g(y), respectively, the linear combination of the variate group x is $f(x)=\Sigma(a_i \cdot x_i)$, and the linear combination of the variate group y is $g(y)=\Sigma(b_i \cdot y_i)$. Next, provided that the number of information used in the current canonical correlation analysis is $q(q \geq 2)$, the q data sets of the variate group x and the variate group y are substituted into the above linear combinations, respectively, and a plurality of equations including the coefficients $a_i$, $b_i$ as variates to be determined are generated. Furthermore, the coefficients $a_i$, $b_i$ are determined so that the correlation coefficient $r_{xy}$ between the canonical variates f(x) and g(y) is at the maximum. Accordingly, the canonical correlation coefficients ($a_i$, $b_i$) are obtained.

In the present embodiment, provided that the power generation parameter Pg is the variate group x, and the strain parameter is the variate group y, the learning data L includes a data set of data over a predetermined period, for instance, obtained by measuring each variate group a plurality of times at different measurement timings. Further, the canonical correlation learning part 5L performs a canonical correlation analysis on the learning data L, and determines the canonical correlation coefficients ($a_i$, $b_i$) by machine learning so that the correlation coefficient $r_{xy}$ between the canonical variate f(x) related to the power generation parameter Pg (variate group x) and the canonical variate g(y) related to the strain parameter Pt (variate group y) is at the maximum.

For instance, with regard to the strain parameter Pt, in some embodiments, the canonical correlation learning part 5L may use the data of the learning data L itself as the variate group y. In some other embodiments, the feature amount may be extracted from the learning data L to be used as the variate group y. For instance, the feature amount may be the maximum or the minimum, or a statistic value such as an average, in each of the time units obtained by dividing the data over a predetermined period constituting the learning data L into smaller time units such as minutes. In this case, provided that the data over a predetermined period is data of H minutes and the data is divided into units of M minutes, the number of minimums, maximums, or statistic values is H/M. Thus, the variate group y may include these minimums or maximums, or these minimums and maximums, or statistic values (see FIGS. 8 and 9 described below). In the embodiment shown in FIG. 7, the canonical correlation learning part 5L is connected to the above described parameter obtaining part 2, and in learning, the parameter obtaining part 2 obtains the learning data L and extracts the feature amount to input the same into the canonical correlation learning part 5L.

As described above, while the canonical correlation analysis is performed on two variate groups x, y, the two variate groups (parameter P) inputted to the canonical correlation learning part 5L may be the measurement values of the respective parameters P themselves. Specifically, for the power generation parameter Pg, in some embodiments, the different kinds of parameter including wind velocity, power generation amount, and rotor rotation speed may be each inputted into the canonical correlation learning part 5L as a variate group x (see FIGS. 8 and 9). In this case, the canonical correlation learning part 5L obtains the canonical correlation with the strain parameter Pt for each kind of power generation parameter Pg. Accordingly, by performing the canonical correlation analysis for each kind of power generation parameter Pg having different physical quantities, abnormality monitoring is performed on each kind of power generation parameter Pg, which makes it possible to achieve a relatively high accuracy in abnormality monitoring. Furthermore, in this case, the above i indicating the number of the variate group x is i=$N_g$ (the total of the wind turbine power generating apparatuses 6 belonging to the monitoring group). In some other embodiments, all of the kinds including wind velocity, generation amount, and rotor rotation speed may be inputted to the canonical correlation learning part 5L as the variate group x, and in this case, the above i indicating the number of the variate group x is i=$N_g$×(the number of kinds of power generation parameter Pg).

Similarly, for the strain parameter Pt, in some embodiments, the different strain parameter measurement sensors 7s (different kinds of measurement) of each wind turbine power generating apparatus 6 may be each inputted into the canonical correlation learning part 5L as a variate group y (see FIGS. 8 and 9). At this time, the measurement values of all of the strain parameter measurement sensors 7s of the wind turbine power generating apparatus 6 may be inputted to the canonical correlation learning part 5L (see FIG. 9), or at least one of the measurement values of the strain parameter measurement sensors 7s may be inputted thereto (see FIG. 8). In this case, the canonical correlation learning part 5L obtains the canonical correlation with the power generation parameter Pg for each kind of strain parameter Pt. As described above, by performing abnormality monitoring for each of the strain parameter measurement sensors 7s, it is possible to eliminate influence from other sensors, and thus it is possible to achieve a relatively high accuracy in abnormality monitoring. In this case, the above i indicating the number of the variate group y is i=$N_g$. In some other embodiments, all of the measurement values of the strain parameter measurement sensors 7s may be used as the variate group y, and in this case, the above i indicating the number of the variate group x is i=$N_g$×(the number of strain parameter measurement sensors 7s of each wind turbine power generating apparatus 6).

Alternatively, the two parameters P inputted into the canonical correlation learning part 5L may be obtained by adding different kinds of calculation to each measurement value. Specifically, for instance, the canonical correlation learning part 5L may be configured to receive the principal component $u_k$ (k=1, 2, . . . ) of at least one of the power generation parameter Pg or the strain parameter Pt (see FIGS. 8 and 9).

Herein, to calculate the principal component of a parameter P, it is necessary to perform principal component analysis on the above described learning data L. In the principal component analysis, the linear combination of a variate group z is generated. Specifically, provided that the the i-th (i=1, 2, . . . ) value of the variate group is $z_i$, the i-th coefficient is $c_i$, and the principal component is u, $u_k(z) = \Sigma (c_i \cdot z_i)$ is generated. In the present embodiment, the variate group z is one of the power generation parameter Pg (variate group x) or the strain parameter Pt (variate group y). Next, provided that the number of information used in the current canonical correlation analysis is q(q≥2), the q variate groups z are substituted into the above linear combinations, respectively, and a plurality of equations including the coefficients $c_i$ as a variate to be determined are generated. Furthermore, the coefficients $c_i$ is determined so that the variance of the principal component $u_k$ is at the maximum. By using the coefficient $c_i$ as described above, it is possible to obtain the principal component $u_k(z)$ of the variate group z from the linear combination expression. Furthermore, whether or not to calculate the k-th principal component may be determined on the basis of the contribution rate of the principal component.

Meanwhile, the group monitoring part 5 performs abnormality monitoring on the monitoring group G on the basis of the canonical correlation obtained by the canonical correlation learning part 5L. Thus, it is necessary to input the same kinds of variate groups x, y to the group monitoring part 5 as those inputted to the canonical correlation learning part 5L. Thus, in the embodiment shown in FIG. 7, the group monitoring part 5 is connected in parallel to the canonical correlation learning part 5L with respect to the parameter obtaining part 2, and the two parameters P outputted by the parameter obtaining part 2 are inputted to the canonical correlation learning part 5L and the group monitoring part 5, respectively.

With the above configuration, it is possible to set the determination criteria of abnormal monitoring by the group monitoring part 5 through machine learning.

Next, abnormality monitoring will be described, which is performed by the group monitoring part 5 on the basis of the canonical correlation learned as described above the principal component analysis results.

In some embodiments, as shown in FIGS. 8 and 9, the group monitoring part 5 may include a canonical correlation deviance determination part 51 configured to determine whether the canonical correlation obtained in learning by the above described canonical correlation learning part 5L is maintained between the power generation parameter Pg (monitoring power generation parameter) and the strain parameter Pt (monitoring strain parameter) obtained in abnormality monitoring, and an abnormality determination part 55 configured to determine presence of an abnormality if the canonical correlation obtained in learning is not maintained between the monitoring power generation parameter and the monitoring strain parameter. Furthermore, if it is determined that an abnormality is present, the abnormality determination part 55 may notify a notification part capable of issuing notification by sound or display (notification part), of the presence of an abnormality.

More specifically, in some embodiments, the canonical correlation deviance determination part 51 may include a monitored value calculation part 52 configured to calculate a monitored value T based on the monitoring power generation parameter, a predicted value calculation part configured to calculate a predicted value Tp of the monitored value T from the monitoring strain parameter, and a deviance determination part configured to determine whether the canonical correlation obtained in learning is maintained, on the basis of comparison between the monitored value T and the predicted value Tp. That is, a prediction expression for calculating the monitored value T is generated before abnormality monitoring on the basis of the monitoring power generation parameter, and the predicted value calculation part 53 calculates the monitored value T on the basis of the prediction expression.

Specifically, the prediction expression may be generated by defining the prediction expression as $f(x)=d \times g(y)+e$, where $f(x)$ is the canonical variate of the power generation parameter Pg (variate group x), $g(y)$ is the canonical variate of the strain parameter Pt, the coefficient is d, and the constant is e. Then, the coefficients d and e may be determined by using the measurement values of the power generation parameter Pg and the strain parameter Pt included in the learning data L. That is, in this case, the prediction expression for calculating the predicted value Tp is $Tp=d \times g(y)+e=d \times \Sigma(b_i \cdot y_i)+e$. Furthermore, the monitored value calculation part 52 calculates the monitored value T as $T=f(x)=\Sigma(a_i \cdot x_i)$. Furthermore, the canonical correlation deviance determination part 51 compares the monitored value T and the predicted value Tp, and if the difference is not smaller than a predetermined value, determines that the above correlation is not maintained. In contrast, if the difference is smaller than a predetermined value, the canonical correlation deviance determination part 51 determines that the correlation is maintained. A predetermined value for determining whether the correlation is maintained may be determined through machine learning.

With the above configuration, it is possible to determine easily whether the canonical correlation in learning is maintained in monitoring, on the basis of comparison between the monitored value T calculated on the basis of the power generation parameter P obtained in monitoring and the predicted value Tp calculated on the basis of the strain parameter Pt (monitoring strain parameter).

Further, in some embodiments, as described above, the power generation parameter $u_k$ of the power generation parameter Pg is inputted in to the canonical correlation learning part 5L, and thus the power generation parameter $u_k$ of the power generation parameter Pg is also inputted to the group monitoring part 5 as shown in FIGS. 8 and 9. That is, in the present embodiment, the abnormality monitoring apparatus 1 further includes a power generation parameter principal component analysis part 5p configured to obtain the power generation parameter principal component $u_{gk}$, which is a principal component of the power generation parameter Pg on which principal component analysis is performed, by using the result of the principal component analysis (described below) to be performed on each power generation parameter Pg of the wind turbine power generating apparatuses 6 belonging to the monitoring group G. Further, the canonical correlation learning part 5L is configured to obtain the canonical correlation between the power generation parameter principal component $u_{gk}$ and each strain parameter Pt of the wind turbine power generating apparatuses 6 belonging to the monitoring group G.

In the embodiment shown in FIGS. 8 and 9, as shown in the drawings, the power generation parameter principal component analysis part Sp is disposed between the parameter obtaining part 2 and the group monitoring part 5 (canonical correlation deviance determination part 51), and the output of the power generation parameter principal component analysis part 5b (power generation parameter principal component $u_{gk}$) is inputted to both of the canonical correlation learning part 5L and the group monitoring part 5. In the present embodiment, when each kind of power generation parameter Pg is used individually as the variate group x for calculating the canonical correlation, the number of data (i) included in the variate group x is i=(maximum of k), and when all kinds of power generation parameter Pg are used as the variate group x, the number of data (i) is i=(maximum of k)×(number of kinds of power generation parameter Pg).

With the above configuration, it is possible to obtain the canonical correlation between the principal component of the power generation parameter Pg (power generation parameter principal component ukg) and the strain parameter Pt of the wind turbine power generating apparatuses 6 belonging to the monitoring group G By using the principal component of the power generation parameter Pg to obtain the canonical correlation, it is possible to reduce an influence of deviance components of the plurality of power generation parameters Pg from the plurality of wind turbine power generating apparatuses 6 belonging to the monitoring group G, and to improve accuracy in abnormality monitoring.

Further, in some embodiments, as described above, the principal component $u_l$ (l=1, 2, . . . ) of the strain parameter Pt is inputted into the canonical correlation learning part 5L. Thus, as shown in FIG. 9, the group monitoring part 5 also receives the principal component $u_l$ of the strain parameter Pt. That is, in the present embodiment, the abnormality monitoring apparatus 1 further includes a strain parameter principal component analysis part 5t configured to obtain the strain parameter principal component $u_{tl}$, which is a principal component of the strain parameter Pt on which principal component analysis is performed, by using the result of the principal component analysis (described below) to be performed on each strain parameter Pt of the wind turbine power generating apparatuses 6 belonging to the monitoring group G Further, the canonical correlation learning part 5L is configured to obtain the canonical correlation between the power generation parameter principal component $u_{gk}$ and the strain parameter principal component $u_{tl}$.

In the embodiment shown in FIGS. 8 and 9, as shown in the drawings, the strain parameter principal component analysis part 5t is disposed between the parameter obtaining part 2 and the group monitoring part 5 (canonical correlation deviance determination part 51), and the output of the strain parameter principal component analysis part 5t (strain parameter principal component $u_{tl}$) is inputted to both of the canonical correlation learning part 5L and the group monitoring part 5. In the embodiment shown in FIG. 9, the strain parameter Pt receives the above described feature amount, and the group monitoring part 5 receives both of the maximum and the minimum of each strain parameter measurement sensor 7s (in FIG. 9, the strain parameter principal component $u_{tl}$ thereof). In the present embodiment, when each kind of measurement value of strain parameter Pt is used as the variate group y, the number of data (i) included in the variate group y is i=(maximum of l), and when all kinds of strain parameter Pt are used as the variate group y, the number of data (i) is i=(maximum of l)×(number of kinds of measurement values of strain parameter Pt).

With the above configuration, it is possible to obtain the canonical correlation between the principal component $u_k$ of the power generation parameter Pg (power generation parameter principal component $u_{kg}$) and the principal component of the strain parameter Pt (strain parameter principal component $u_{tl}$) of the wind turbine power generating apparatuses 6 belonging to the monitoring group G By using the principal component $u_l$ of the strain parameter Pt to obtain the canonical correlation, it is possible to reduce an influence of deviance components of the plurality of strain parameters Pt from the plurality of wind turbine power generating apparatuses 6 belonging to the monitoring group G, and to improve accuracy in abnormality monitoring.

However, the present invention is not limited to the present embodiment. In some embodiments, as shown in FIG. 8, the abnormality monitoring apparatus 1 may not necessarily include the strain parameter principal component analysis part 5t. In the embodiment shown in FIG. 8, only the measurement values of the strain parameter measurement sensor 7s disposed on the LP side of the first blade are inputted into the group monitoring part 5 and the canonical correlation learning part 5L, and only the minimum value thereof (LPmin) is inputted.

Next, the abnormality monitoring method corresponding to abnormality monitoring of the monitoring group G performed by the above described abnormality monitoring apparatus 1 (group monitoring part 5) will be described along the flow in FIG. 10 (flow related to abnormality monitoring of the monitoring group).

First, a method corresponding to the embodiment related to the above described machine learning will be described. As shown in FIG. 10, in some embodiments, the abnormality monitoring method further includes a canonical correlation learning step (S41 to S45) of obtaining a canonical correlation between the power generation parameter Pg and the strain parameter Pt of the wind turbine power generating apparatuses 6 belonging to the monitoring group G, in learning before performing abnormality monitoring in the group monitoring step (S5). In the present embodiment, the group monitoring step (S5) includes performing abnormality monitoring on the monitoring group G on the basis of the canonical correlation obtained in the canonical correlation learning step.

After obtaining the learning data L related to each wind turbine power generating apparatus 6 included in the above described monitoring group G in step S41 in FIG. 10, the power generation parameter Pg and the strain parameter Pt for performing abnormality monitoring are extracted (obtained) from the obtained learning data L in step S42. In step S43, data (measurement values) of the two extracted parameters P are normalized (standardized). In the embodiment shown in FIG. 10, step S43 is performed to generate input data for the subsequent steps (S44 and S45). In some other embodiments, step S43 may be omitted.

In step S44, principal component analysis of the parameters P is performed. In some embodiments, the principal component analysis may be performed on at least one of the power generation parameter Pg or the strain parameter Pt. In this case, when the parameter P includes a plurality of parameters such as wind velocity, generation amount, etc, the principal component analysis may be performed for each kind, or may be performed on the collection of the different kinds of data. The principal component analysis is described above and thus not described in detail again. In some other embodiments, step S44 may be omitted.

In step S45, canonical correlation analysis of the two parameters P is performed. In the present embodiment, in the previous step S44, principal component analysis is performed on each power generation parameter Pg of the wind turbine power generating apparatuses 6 belonging to the monitoring group G Thus, for the parameter P on which the principal component analysis is performed, the principal component calculated by using the result thereof is used in the canonical correlation analysis. In contrast, for the parameter P on which the principal component analysis is not performed, the measurement value of the parameter P itself is used in the canonical correlation analysis. The canonical correlation analysis is described above and thus will not be described in detail again.

Next, an embodiment related to the group monitoring step (S5) will be used with reference to FIG. 11.

As shown in FIG. 11, in some embodiments, the group monitoring step (S5) includes a canonical correlation deviance determination step (S50) of determining whether the canonical correlation obtained in learning in the above described canonical correlation learning step (S45) is maintained between the power generation parameter Pg (monitoring power generation parameter) and the strain parameter Pt (monitoring strain parameter) obtained in abnormality monitoring, and an abnormality determination step (S54) of determining presence of an abnormality if the canonical correlation obtained in learning is not maintained between the monitoring power generation parameter and the monitoring strain parameter.

More specifically, in some embodiments, the canonical correlation deviance determination step (S50) may include a monitored value calculation step (S51) of calculating a monitored value T based on the monitoring power generation parameter, a predicted value calculation step (S52) of calculating a predicted value Tp of the monitored value T from the monitoring strain parameter, and a determination step (S53) of determining whether the canonical correlation obtained in learning is maintained, on the basis of comparison between the monitored value T and the predicted value Tp. That is, a prediction expression for calculating the monitored value T is generated in advance on the basis of the monitoring power generation parameter, and the monitoring strain parameter is substituted into the prediction expression to obtain the predicted value Tp. The prediction expression is described above, and will not be described again in detail.

Embodiments of the present invention were described in detail above, but the present invention is not limited thereto, and various amendments and modifications may be implemented.

The invention claimed is:

1. An abnormality monitoring apparatus for a wind farm, which is configured to perform abnormality monitoring on a monitoring group including at least two of a plurality of wind turbine power generating apparatuses belonging to a windfarm, the abnormality monitoring apparatus comprising:
a parameter obtaining part configured to obtain, from each of at least two of the plurality of wind turbine power generating apparatuses, a power generation parameter related to power generation of the wind turbine power generating apparatus and a strain parameter measured by a sensor mounted to a wind turbine blade of the wind turbine power generating apparatus;
a member candidate extraction part configured to extract, as member candidates of the monitoring group, at least two of the wind turbine power generating apparatuses in which a correlation between the power generation parameters of the at least two wind turbine power generating apparatuses obtained by the parameter obtaining part is not smaller than a first predetermined value, and a correlation between the strain parameters of the at least two wind turbine power generating apparatuses is not smaller than a second predetermined value, the first predetermined value being a threshold set in advance as having a certain correlation or more, the second predetermined value being a threshold set in advance as having a certain correlation or more;

a monitoring group setting part configured to set, as members of the monitoring group, at least two of the wind turbine power generating apparatuses from among the member candidates; and a group monitoring part configured to perform abnormality monitoring on the monitoring group set by the monitoring group setting part.

2. The abnormality monitoring apparatus for a wind farm according to claim 1, wherein the member candidate extraction part includes:

a first member candidate group selection part configured to select a first member candidate group including at least two of the plurality of wind turbine power generating apparatuses;

a parameter correlation calculation part configured to obtain a correlation between the power generation parameters of the wind turbine power generating apparatuses belonging to the first member candidate group;

a second member candidate group selection part configured to select, from the first member candidate group, a second member candidate group including at least two of the wind turbine power generating apparatuses in which the correlation obtained by the power generation parameter correlation calculation part is not smaller than the first predetermined value;

a strain parameter correlation calculation part configured to obtain a correlation between the strain parameters of the wind turbine power generating apparatuses belonging to the second member candidate group; and a member candidate determination part configured to determine, as the member candidates, the wind turbine power generating apparatuses in which the correlation obtained by the strain parameter correlation calculation part is not smaller than the second predetermined value, from the second member candidate group.

3. The abnormality monitoring apparatus for a wind farm according to claim 1, further comprising a canonical correlation learning part configured to obtain a canonical correlation between the power generation parameter and the strain parameter of the wind turbine power generating apparatus belonging to the monitoring group, in learning before execution of the abnormality monitoring by the group monitoring part, wherein the group monitoring part is configured to perform the abnormality monitoring on the monitoring group on the basis of the canonical correlation obtained by the canonical correlation learning part.

4. The abnormality monitoring apparatus for a wind farm according to claim 3, wherein the group monitoring part includes:

a canonical correlation deviance determination part configured to determine whether the canonical correlation obtained during the learning is maintained to be between a monitoring power generation parameter and a monitoring strain parameter obtained during the abnormality monitoring; and an abnormality determination part configured to determine presence of an abnormality if the canonical correlation deviance determination part determines that the canonical correlation is not maintained.

5. The abnormality monitoring apparatus for a wind farm according to claim 4, wherein the canonical correlation deviance determination part includes:

a monitored value calculation part configured to calculate a monitored value based on the monitoring power generation parameter;

a predicted value calculation part configured to calculate a predicted value of the monitored value from the monitoring strain parameter, by using the canonical correlation obtained during the learning; and a deviance determination part configured to determine whether the canonical correlation obtained during the learning is maintained, on the basis of comparison between the monitored value and the predicted value.

6. The abnormality monitoring apparatus for a wind farm according to claim 3, further comprising a principal component analysis part configured to obtain, by using a result of a principal component analysis to be performed on the power generation parameter of each of the wind turbine power generating apparatuses belonging to the monitoring group, a power generation parameter principal component which is a principal component of the power generation parameter on which the principal component analysis is performed, wherein the canonical correlation learning part is configured to obtain the canonical correlation between the power generation parameter principal component and the strain parameter of each of the wind turbine power generating apparatuses belonging to the monitoring group.

7. The abnormality monitoring apparatus for a wind farm according to claim 6, further comprising a strain parameter principal component analysis part configured to obtain, by using a result of a principal component analysis to be performed on the strain parameter of each of the wind turbine power generating apparatuses belonging to the monitoring group, a strain parameter principal component which is a principal component of the strain parameter on which the principal component analysis is performed, wherein the canonical correlation learning part is configured to obtain the canonical correlation between the power generation parameter principal component and the strain parameter principal component.

8. The abnormality monitoring apparatus for a wind farm according to claim 6, wherein the power generation parameter includes at least one kind of parameter from among a wind velocity, a power generation amount, and a rotor rotation speed, and wherein the power generation principal component analysis part is configured to obtain the power generation parameter principal component for each kind of the power generation parameter.

9. The abnormality monitoring apparatus for a wind farm according to claim 1, wherein the sensor mounted to the wind turbine blade is a sensor part included in an optical fiber sensor.

10. An abnormality monitoring method for a wind farm, of performing abnormality monitoring on a monitoring group including at least two of a plurality of wind turbine power generating apparatuses belonging to a windfarm, the abnormality monitoring method comprising:

a parameter obtaining step of obtaining, from each of at least two of the plurality of wind turbine power generating apparatuses, a power generation parameter related to power generation of the wind turbine power generating apparatus and a strain parameter measured by a sensor mounted to a wind turbine blade of the wind turbine power generating apparatus;

a member candidate extraction step of extracting, as member candidates of the monitoring group, at least two of the wind turbine power generating apparatuses in which a correlation between the power generation parameters of the at least two wind turbine power generating apparatuses obtained in the parameter obtaining step is not smaller than a first predetermined value, and a correlation between the strain parameters of the at least two wind turbine power generating apparatuses is not smaller than a second predetermined value, the first predetermined value being a threshold set in advance as having a certain correlation or more, the second predetermined value being a threshold set in advance as having a certain correlation or more;

a monitoring group setting step of setting, as members of the monitoring group, at least two of the wind turbine power generating apparatuses from among the member candidates; and a group monitoring step of performing abnormality monitoring on the monitoring group set in the monitoring group setting step.

11. The abnormality monitoring method for a wind farm according to claim 10, wherein the member candidate extraction step includes:

a first member candidate group selection step of selecting a first member candidate group including at least two of the plurality of wind turbine power generating apparatuses;

a parameter correlation calculation step of obtaining a correlation between the power generation parameters of the wind turbine power generating apparatuses belonging to the first member candidate group;

a second member candidate group selection step of selecting, from the first member candidate group, a second member candidate group including at least two of the wind turbine power generating apparatuses in which the correlation obtained in the power generation parameter correlation calculation step is not smaller than the first predetermined value;

a strain parameter correlation calculation step of obtaining a correlation between the strain parameters of the wind turbine power generating apparatuses belonging to the second member candidate group; and a member candidate determination step of determining, as the member candidates, the wind turbine power generating apparatuses in which the correlation obtained in the strain parameter correlation calculation step is not smaller than the second predetermined value, from the second member candidate group.

12. The abnormality monitoring method for a wind farm according to claim 10, further comprising a canonical correlation learning step of obtaining a canonical correlation between the power generation parameter and the strain parameter of the wind turbine power generating apparatus belonging to the monitoring group, in learning before execution of the abnormality monitoring in the group monitoring step, wherein the group monitoring step is configured to perform the abnormality monitoring on the monitoring group on the basis of the canonical correlation obtained in the canonical correlation learning step.

13. The abnormality monitoring method for a wind farm according to claim 12, wherein the group monitoring step includes:

a canonical correlation deviance determination step of determining whether the canonical correlation obtained during the learning is maintained to be between a monitoring power generation parameter and a monitoring strain parameter obtained during the abnormality monitoring; and an abnormality determination step of determining presence of an abnormality if it is determined that the canonical correlation is not maintained in the canonical correlation deviance determination step.

14. The abnormality monitoring method for a wind farm according to claim 13, wherein the canonical correlation deviance determination step includes:

a monitored value calculation step of calculating a monitored value based on the monitoring power generation parameter;

a predicted value calculation step of calculating a predicted value of the monitored value from the monitoring strain parameter, by using the canonical correlation obtained during the learning; and a deviance determination step of determining whether the canonical correlation obtained during the learning is maintained, on the basis of comparison between the monitored value and the predicted value.

15. The abnormality monitoring method for a wind farm according to claim 12, further comprising a principal component analysis step of obtaining, by using a result of a principal component analysis to be performed on the power generation parameter of each of the wind turbine power generating apparatuses belonging to the monitoring group, a power generation parameter principal component which is a principal component of the power generation parameter on which the principal component analysis is performed, wherein the canonical correlation learning step includes obtaining the canonical correlation between the power generation parameter principal component and the strain parameter of each of the wind turbine power generating apparatuses belonging to the monitoring group.

16. The abnormality monitoring method for a wind farm according to claim 15, further comprising a strain parameter principal component analysis step of obtaining, by using a result of a principal component analysis to be performed on the strain parameter of each of the wind turbine power generating apparatuses belonging to the monitoring group, a strain parameter principal component which is a principal component of the strain parameter on which the principal component analysis is performed, wherein the canonical correlation learning step includes obtaining the canonical correlation between the power generation parameter principal component and the strain parameter principal component.

17. The abnormality monitoring method for a wind farm according to claim 15, wherein the power generation parameter includes at least one kind of parameter from among a wind velocity, a power generation amount, and a rotor rotation speed, and wherein the power generation principal component analysis step includes obtaining the power generation parameter principal component for each kind of the power generation parameter.

18. The abnormality monitoring method for a wind farm according to claim 10, wherein the sensor mounted to the wind turbine blade is a sensor part included in an optical fiber sensor.

* * * * *